(12) United States Patent
Yeh

(10) Patent No.: US 9,058,256 B2
(45) Date of Patent: Jun. 16, 2015

(54) DATA WRITING METHOD, MEMORY CONTROLLER AND MEMORY STORAGE APPARATUS

(71) Applicant: PHISON ELECTRONICS CORP., Miaoli (TW)

(72) Inventor: Chih-Kang Yeh, Kinmen County (TW)

(73) Assignee: PHISON ELECTRONICS CORP., Miaoli (TW)

( * ) Notice: Subject to any disclaimer, the term of this patent is extended or adjusted under 35 U.S.C. 154(b) by 174 days.

(21) Appl. No.: 13/961,851

(22) Filed: Aug. 7, 2013

(65) Prior Publication Data

US 2014/0372668 A1    Dec. 18, 2014

(30) Foreign Application Priority Data

Jun. 14, 2013    (TW) .............................. 102121181 A

(51) Int. Cl.
*G06F 12/10*    (2006.01)
*G06F 12/02*    (2006.01)
*G06F 3/06*    (2006.01)
*G11C 16/10*    (2006.01)

(52) U.S. Cl.
CPC .......... *G06F 12/0246* (2013.01); *G06F 3/0647* (2013.01); *G11C 16/102* (2013.01); *G06F 12/0292* (2013.01)

(58) Field of Classification Search
CPC ............ G06F 12/0246; G06F 12/0292; G06F 3/0647; G11C 16/102
USPC ........................................................ 711/103
See application file for complete search history.

(56) References Cited

U.S. PATENT DOCUMENTS

| | | | |
|---|---|---|---|
| 5,200,959 A * | 4/1993 | Gross et al. .................... | 714/723 |
| 7,430,632 B2 * | 9/2008 | Kim et al. ...................... | 711/103 |
| 2003/0163663 A1 * | 8/2003 | Aasheim et al. .............. | 711/202 |
| 2009/0089485 A1 * | 4/2009 | Yeh ............................... | 711/103 |

* cited by examiner

*Primary Examiner* — Jae Yu
(74) *Attorney, Agent, or Firm* — Jianq Chyun IP Office

(57) ABSTRACT

A data writing method for a rewritable non-volatile memory module is provided. The method includes selecting at least one physical erasing unit as a global random area and building a global random area searching table for recording update information corresponding to updated logical pages that data stored in the global random area belongs to. The method also includes receiving updated data belonging to a logical page; and determining whether a data dispersedness degree corresponding to the global random area is smaller than a data dispersedness degree threshold. The method further includes, if the data dispersedness degree corresponding to the global random area is smaller than the data dispersedness degree threshold, writing the update data into the global random area and recording update information corresponding to the logical page in the global random area searching table.

21 Claims, 21 Drawing Sheets

DATA WRITING METHOD, MEMORY CONTROLLER AND MEMORY STORAGE APPARATUS

CROSS-REFERENCE TO RELATED APPLICATION

This application claims the priority benefit of Taiwan application serial no. 102121181, filed on Jun. 14, 2013. The entirety of the above-mentioned patent application is hereby incorporated by reference herein and made a part of this specification.

BACKGROUND

1. Technology Field

The present invention relates to a data writing method for a rewritable non-volatile memory module, a memory controller and a memory storage apparatus using the method.

2. Description of Related Art

Along with the widespread of digital cameras, cell phones, and MP3 in recently years, the consumers' demand for storage media has increased drastically. Since a rewritable non-volatile memory is characterized by non-volatility of data, low power consumption, small volume, non-mechanical structure, and fast reading and writing speed, the rewritable non-volatile memory is the most adaptable memory to be applied in a portable electronic product, e.g., a notebook computer. A solid state drive is a storage apparatus adopting flash memory as storage medium. Therefore, the flash memory industry has become a very popular part of the electronic industry in recent years.

A flash memory module has a plurality of physical erasing units, and each of the physical erasing units has a plurality of physical programming units, wherein data must be written into physical programming units according to the sequence of the physical programming units in the physical erasing unit. In addition, a physical programming unit containing data has to be erased before it is used for writing new data. Particularly, each physical erasing unit is the smallest erasing unit, and each physical programming unit is the smallest programming (i.e., writing) unit. Therefore, in the management of the flash memory module, the physical erasing units are grouped into a data area and a spare area.

The physical erasing units of the data area are used for storing data written by the host system 1000. To be more specific, a memory management circuit in a memory storage apparatus converts a logical access address accessed by the host system into a logical page of a logical block and maps the logical page of the logical block to a physical programming unit of a physical erasing unit in the data area. Namely, in the management of a flash memory module, the physical erasing units in the data area are deemed used physical erasing units (e.g., the physical erasing units already contain data written by the host system). For example, the memory management circuit records the mapping relationship between the logical blocks and the physical erasing units in the data area in a logical-to-physical address mapping table, wherein the logical pages of each logical block are sequentially mapped to the physical programming units of the corresponding physical erasing unit.

And, the physical erasing units of the spare area are used for substituting the physical erasing units of the data area. In particular, a physical erasing unit already containing data has to be erased before it is used for writing new data, while a physical erasing unit in the spare area is used for writing updated data in replacement of the physical erasing unit originally mapped to a logical block. Hence, the physical erasing units in the spare area are either blank or usable physical erasing units (i.e., these physical erasing units do not contain data, or these physical erasing units contain data marked as invalid data).

Namely, the physical programming units of the physical erasing units in the data area and the spare area alternately map the logical pages of the logical blocks for containing data written by the host system. For example, the memory management circuit of the memory storage apparatus takes at least a physical erasing unit from the spare area as a global random physical erasing unit, and when the logical access address storing the updated data desired to be written by the host system corresponds to a logical page of a logical block in the storage apparatus, the memory management circuit in the storage apparatus writes the updated data into the physical programming units of the global random physical erasing unit.

In particular, during the operation of memory storage apparatus, when the global random physical erasing units will be exhausted, the memory management circuit of the memory storage apparatus copies data stored in the global random physical erasing units to the corresponding physical erasing units (referred to as "the valid data merging operation"), thereby releasing the storage space of the global random physical erasing units to execute next write commands. After copying the data stored in the global random physical erasing units to the corresponding physical erasing units, the memory management circuit of the memory storage apparatus may update the logical-to-physical address mapping table such that follow-up access operations can be performed successfully. Because the capacity of a memory storage apparatus is more and more large, a plurality of logical-to-physical address mapping tables are used for recording mappings of all logical blocks and physical erasing units. Accordingly, when the valid data merging operation must be performed first before a write command from a host system is executed, operations of loading and restoring different logical-to-physical address mapping tables to recording mapping information into the logical-to-physical address mapping tables may be performed and therefore a delay for executing write command may be occurs, thereby influencing the performance of the memory storage apparatus.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

The present invention provides a data writing method, a memory controller and a memory storage apparatus, which can effectively reduce a delay due to the valid data merging operation for the global random physical erasing units during the execution of write commands.

According to an exemplary embodiment of the present invention, a data writing method for writing data into a rewritable non-volatile memory module is provided, wherein the rewritable non-volatile memory module includes a plurality of physical erasing units, each of the physical erasing units includes a plurality of physical programming units, the physical erasing units are at least grouped into a data area and a spare area, the physical erasing units of the spare area are used for substituting the physical erasing units of the data area to write data, a plurality of logical units are configured for mapping to the physical erasing units of the data area, and each of the logical units includes a plurality of logical pages. The data writing method includes selecting at least a physical erasing unit from the physical erasing units of the spare area as a global random area, wherein the global random area is used for temporarily storing data belonging to a plurality of updated logical pages, and the updated logical pages belong to a plurality of updated logical units among the logical units. The data writing method further includes building a global random area searching table to record a plurality of updated information corresponding to the updated logical pages in the global random area. The data writing method further includes receiving a write command and an updated data corresponding to the write command, wherein the updated data belongs to a first logical page and the first logical page belongs to a first logical unit among the logical units. The data writing method further includes recording a data dispersedness degree corresponding to the global random area; determining whether the data dispersedness degree corresponding to the global random area is smaller than a data dispersedness degree threshold; and if the data dispersedness degree corresponding to the global random area is smaller than the data dispersedness degree threshold, writing the updated data into the global random area and recording updated information corresponding to the first logical page in the global random area searching table.

According to an exemplary embodiment of the present invention, a memory controller for controlling a rewritable non-volatile memory module is provided, wherein the rewritable non-volatile memory module includes a plurality of physical erasing units, each of the physical erasing units includes a plurality of physical programming units, the physical erasing units are at least grouped into a data area and a spare area, the physical erasing units of the spare area are used for substituting the physical erasing units of the data area to write data. The memory controller includes a host interface, a memory interface and a memory management circuit. The host interface is coupled to a host system. The memory interface is coupled to the rewritable non-volatile memory module. The memory management circuit is coupled to the host interface and the memory interface and configured to configure a plurality of logical units for mapping to the physical erasing units of the data area, wherein each of the logical units includes a plurality of logical pages. Additionally, the memory management circuit is further configured to select at least a physical erasing unit from the physical erasing units of the spare area as a global random area, wherein the global random area is used for temporarily storing data belonging to a plurality of updated logical pages, and the updated logical pages belong to a plurality of updated logical units among the logical units. And, the memory management circuit is further to build a global random area searching table to record a plurality of updated information corresponding to the updated logical pages in the global random area. Herein, the memory management circuit is further configured to receive a write command and an updated data corresponding to the write command, wherein the updated data belongs to a first logical page and the first logical page belongs to a first logical unit. Furthermore, the memory management circuit is further configured to record a data dispersedness degree corresponding to the global random area and determine whether the data dispersedness degree corresponding to the global random area is smaller than a data dispersedness degree threshold. If the data dispersedness degree corresponding to the global random area is smaller than the data dispersedness degree threshold, the memory management circuit writes the updated data into the global random area and records updated information corresponding to the first logical page in the global random area searching table.

According to an exemplary embodiment of the present invention, a memory storage apparatus including a connector, a rewritable non-volatile memory module, and a memory controller is provided. The connector is coupled to a host system. The rewritable non-volatile memory module includes a plurality of physical erasing units, each of the physical erasing units includes a plurality of physical programming units, the physical erasing units are at least grouped into a data area and a spare area, and the physical erasing units of the spare area are used for substituting the physical erasing units of the data area to write data. The memory controller is coupled to the connector and configured to configure a plurality of logical units for mapping to the physical erasing units of the data area, wherein each of the logical units includes a plurality of logical pages. Additionally, the memory controller is further configured to select at least a physical erasing unit from the physical erasing units of the spare area as a global random area, wherein the global random area is used for temporarily storing data belonging to a plurality of updated logical pages, and the updated logical pages belong to a plurality of updated logical units among the logical units. And, the memory controller is further to build a global random area searching table to record a plurality of updated information corresponding to the updated logical pages in the global random area. Herein, the memory controller is further configured to receive a write command and an updated data corresponding to the write command, wherein the updated data belongs to a first logical page and the first logical page belongs to a first logical unit. Furthermore, the memory controller is further configured to record a data dispersedness degree corresponding to the global random area and determine whether the data dispersedness degree corresponding to the global random area is smaller than a data dispersedness degree threshold. If the data dispersedness degree corresponding to the global random area is smaller than the data dispersedness degree threshold, the memory controller writes the updated data into the global random area and records updated information corresponding to the first logical page in the global random area searching table.

Based on the above, according to the data writing method, the memory controller, and the memory storage apparatus described in the exemplary embodiments of the present invention, the time needed for updating logical-physical mapping tables during an execution of a valid data merging operation for global random physical erasing units can be reduced, thereby increasing the speed of executing a write command.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

In order to make the aforementioned features and advantages of the present invention more comprehensible, embodiments accompanying figures are described in detail below.

DESCRIPTION OF EMBODIMENTS

Figure 1:
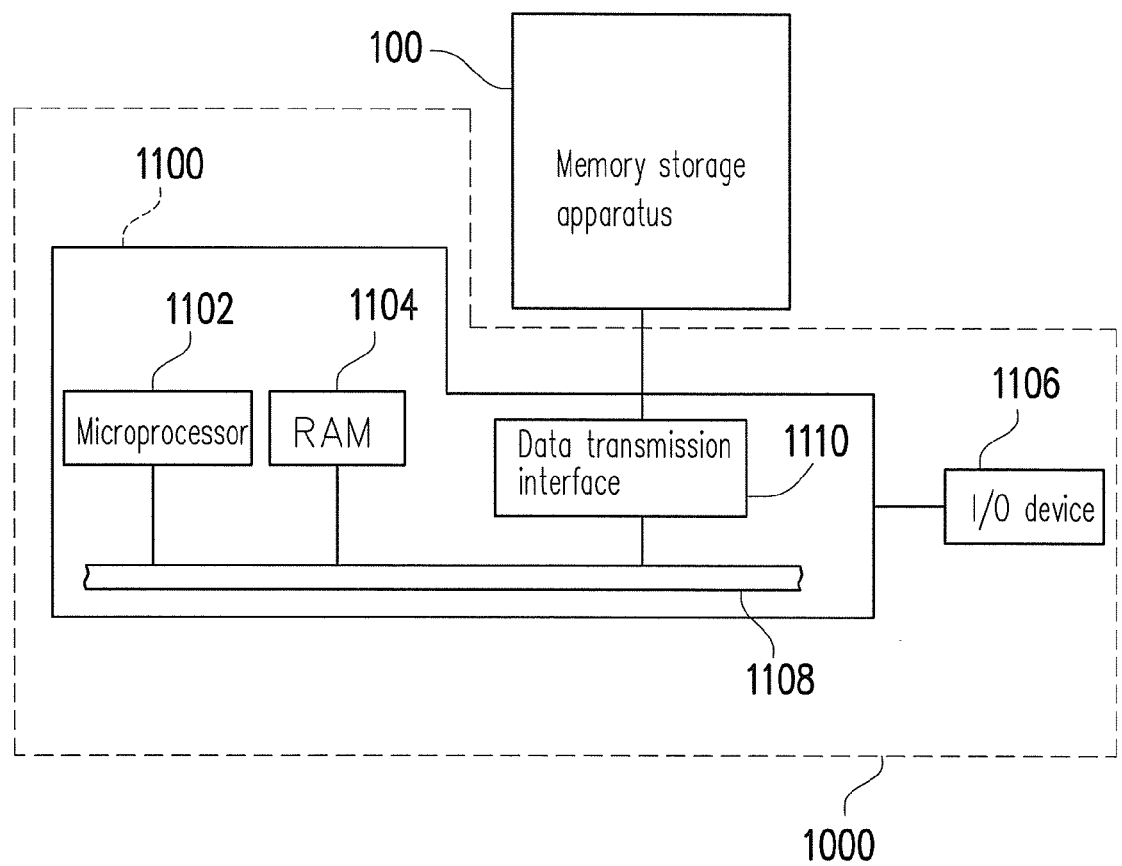
FIG. 1 illustrates a host system and a memory storage apparatus according to an exemplary embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

A memory storage apparatus (i.e., a memory storage system), typically, includes a rewritable non-volatile memory module and a controller (i.e., a control circuit). The memory storage apparatus is usually used together with a host system, such that the host system can write data into or read data from the memory storage apparatus.

FIG. 1 illustrates a host system and a memory storage apparatus according to an exemplary embodiment of the present invention.

Figure 2:
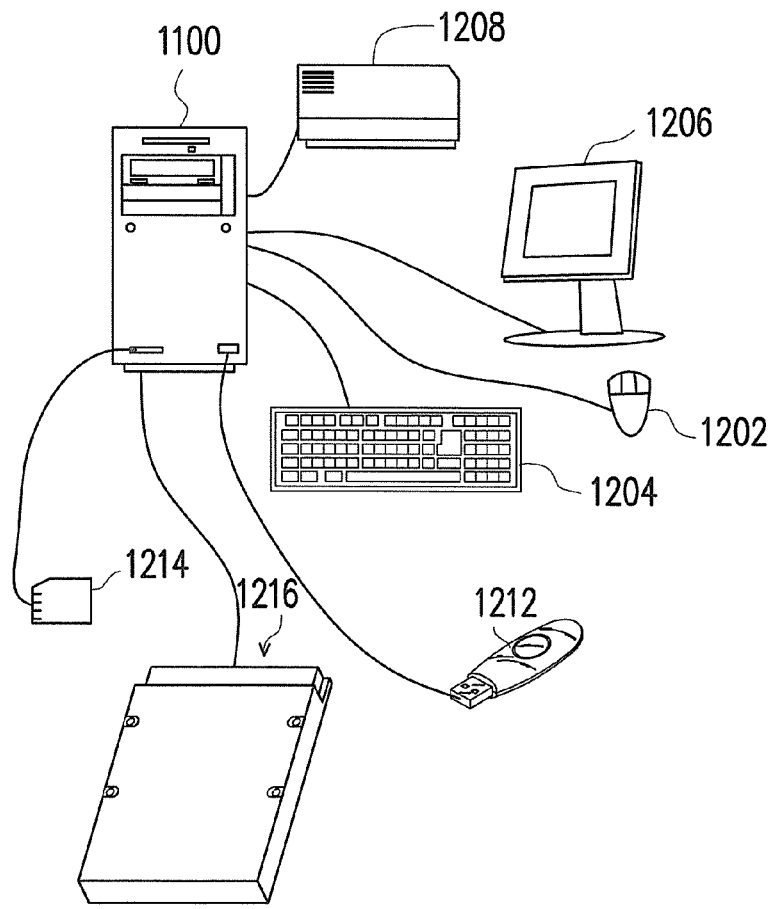
FIG. 2 illustrates a computer, an input/output (I/O) device, and a memory storage device according to the exemplary embodiment of the present disclosure.

Referring to FIG. 1, a host system 1000 in most cases includes a computer 1100 and an input/output (I/O) device 1106. The computer 1100 includes a microprocessor 1102, a random access memory (RAM) 1104, a system bus 1108, and a data transmission interface 1110. The I/O device 1106 includes a mouse 1202, a keyboard 1204, a display 1206, and a printer 1208, as shown in FIG. 2. It should be understood that, the devices depicted in FIG. 2 should not be construed as limitations to the present disclosure, and the I/O device 1106 may include other devices as well.

In the exemplary embodiment of the present invention, the memory storage apparatus 100 is coupled to other devices of the host system 1000 through the data transmission interface 1110. By using the microprocessor 1102, the random access memory (RAM) 1104 and the Input/Output (I/O) device 1106, the data can be write into the memory storage apparatus 100 or can be read from the memory storage apparatus 100. For instance, the memory storage apparatus 100 may be a non-volatile memory storage apparatus, such as a flash drive 1212, a memory card 1214, or a solid state drive (SSD) 1216 as shown in FIG. 2.

Figure 3:
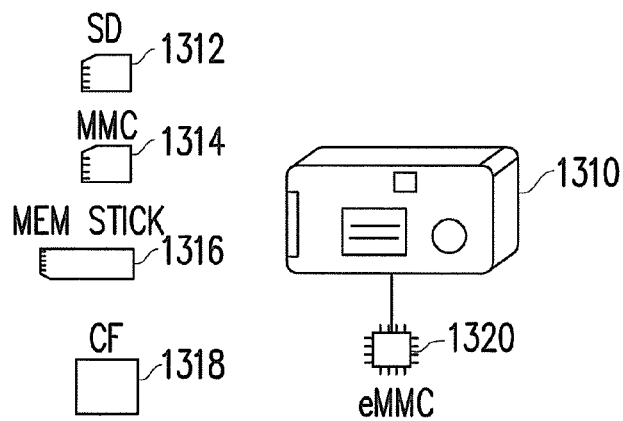
FIG. 3 illustrates a host system and a memory storage apparatus according to an exemplary embodiment of the present invention.

Generally, the host system 1000 can substantially be any system used together with the memory storage apparatus 100 for storing data. Even though the host system 1000 is described as a computer system in the present exemplary embodiment, the host system 1000 in another exemplary embodiment may be a digital camera, a video camera, a communication device, an audio player, a video player, and so on. For instance, if the host system is a digital camera (video camera) 1310, the rewritable non-volatile memory storage apparatus is an SD card 1312, an MMC card 1314, a memory stick 1316, a CF card 1318n or an embedded storage apparatus 1320 (as shown in FIG. 3). The embedded storage device 1320 includes an embedded MMC (eMMC). It should be noted that the eMMC is directly coupled to a substrate of the host system.

Figure 4:
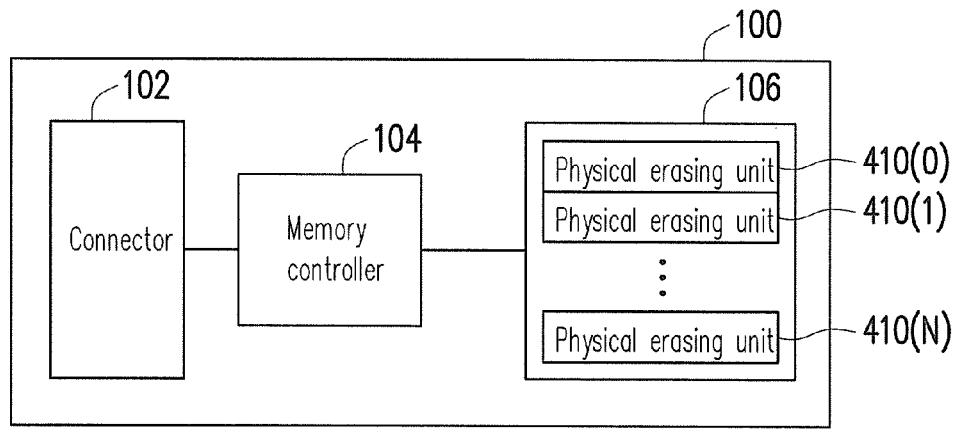
FIG. 4 is a schematic block diagram illustrating the memory storage apparatus depicted in FIG. 1.

FIG. 4 is a schematic block diagram illustrating the memory storage apparatus depicted in FIG. 1.

Referring to FIG. 4, the memory storage apparatus 100 includes a connector 102, a memory controller 104, and a rewritable non-volatile memory module 106.

In the present exemplary embodiment, the connector 102 complies with the serial advanced technology attachment (SATA) standard. However, it should be understood that the present invention is not limited thereto, and the connector 102 may also comply with the parallel advanced technology attachment (PATA) standard, the Institute of Electrical and Electronic Engineers (IEEE) 1394 standard, the peripheral component interconnect (PCI) express standard, the secure digital (SD) standard, the serial advanced technology attachment (SATA) standard, the ultra high speed-I (UHS-I) interface standard, the ultra high speed-II (UHS-II) interface standard, the memory stick (MS) interface standard, the multi media card (MMC) interface standard, the eMMC interface standard, the universal flash storage (UFS) interface standard, the compact flash (CF) standard, the integrated device electronics (IDE) standard, or other suitable standards.

The memory controller 104 is configured to execute a plurality of logic gates or control commands which are implemented in a hardware form or in a firmware form and performing the operations such as data writing, reading or erasing in the rewritable non-volatile memory module 106 according to the command of the host system 1000.

The rewritable non-volatile memory module 106 is coupled to the memory controller 104 and is configured to store data written by the host system 1000. The rewritable non-volatile memory module 106 includes a plurality of physical erasing units 410(0)-410(N). For instance, the physical erasing units 410(0)-410(N) can belong to the same memory die or different memory dies. Each of the physical erasing units includes a plurality of physical programming units, wherein the physical programming units which belong to the same physical erasing unit can be written separately but erased at the same time. However, the present invention is not limited thereto, and each of the physical erasing units may also be comprised of 64, 256, or any other number of physical programming units.

To be more specific, the physical erasing unit is the minimum erasing unit. That is to say, each of the physical erasing unit has a minimum number of memory cells for being erased altogether. Generally, a physical programming unit is the minimum unit for programming. In other words, a physical programming unit is the minimum unit for writing data. Each physical programming unit usually includes a data bit area and a redundant bit area. The data bit area is used for storing user data, and the redundant bit area is used for storing system data (e.g., control information and error checking and correcting (ECC) codes). In this exemplary embodiment, each of the physical programming units is constituted by 4 physical access addresses, and a capacity of each of the physical access addresses is 512 bytes. However, in another exemplary embodiment, the data bit area may contain less or more physical access address, and the number and size of physical access address is not limited thereto. For example, in an exemplary embodiment, one physical erasing unit is one physical block and one physical programming unit is one physical page or physical sector, but the present invention is not limited thereto.

In the present exemplary embodiment, the rewritable non-volatile memory module 106 is a multi level cell (MLC) NAND flash memory module (i.e., each memory cell in the flash memory can store two bits of data). However, the present invention is not limited thereto. The rewritable non-volatile memory module 106 can also be a Single Level Cell (SLC) NAND flash memory module (i.e., each memory cell in the flash memory can store one bit of data), a Trinary Level Cell (TLC) NAND flash memory module (i.e., each memory cell in the flash memory can store three bits of data), other flash memory modules or other memory modules with the same property.

Figure 5:
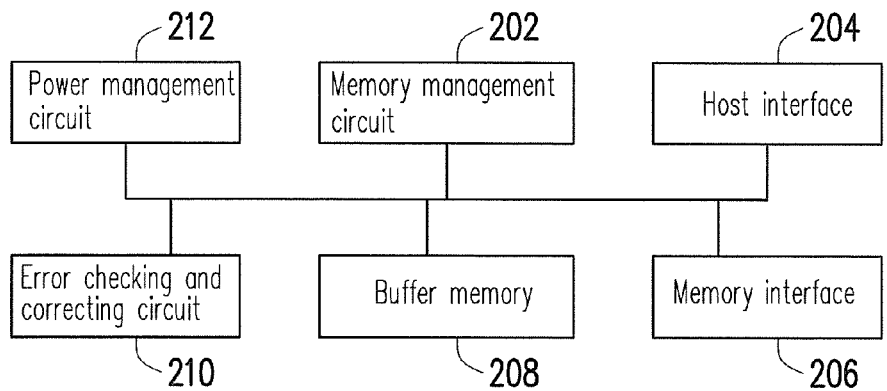
FIG. 5 is a schematic block diagram illustrating a memory controller according to an exemplary embodiment of the present invention.

FIG. 5 is a schematic block diagram illustrating a memory controller according to an exemplary embodiment of the present invention.

Referring to FIG. 5, the memory controller 104 includes a memory management circuit 202, a host interface 204 and a memory interface 206.

The memory management circuit 202 is configured to control the whole operation of the memory controller 104. Particularly, the memory management circuit 202 has a plurality of control instructions; when the memory storage apparatus 100 is operated, the control instructions are executed to perform a data writing operation, a data reading operation, a data erasing operation, and so on.

In the present exemplary embodiment, the control instructions of the memory management circuit 202 are implemented in a form of a firmware. For example, the memory management circuit 202 includes a microprocessor unit (not shown) and a read-only memory (ROM, not shown), wherein the control instructions are burnt in the read-only memory. When the memory storage apparatus 100 is operated, the control instructions are executed by the microprocessor unit to write, read, and erase data.

In another exemplary embodiment of the present invention, the control instructions of the memory management circuit 202 may also be stored in a specific area (for example, a system area in a memory module exclusively used for storing system data) of the rewritable non-volatile memory module 106 as a programming code. Additionally, the memory management circuit 202 may have a microprocessor unit (not shown), a read-only memory (not shown) and a random access memory (not shown). In particular, the ROM has boot codes, and when the memory controller 104 is enabled, the microprocessor unit first executes the boot codes to load the control instructions from the rewritable non-volatile memory module 106 into the RAM of the memory management circuit 202. The microprocessor unit then executes the control instructions to write, read, and erase data.

Furthermore, as in another exemplary embodiment, the control instructions in the memory management circuit 202 are implemented in a form of hardware. For example, the memory management circuit 202 includes a micro controller, a memory cell management circuit, a memory writing circuit, a memory reading circuit, a memory erasing circuit and a data processing circuit. The memory cell management circuit, the memory writing circuit, the memory reading circuit, the memory erasing circuit and the data processing circuit are coupled to the micro controller. The memory cell management circuit is configured to manage physical blocks of the rewritable non-volatile memory module 106. The memory writing circuit is configured to issue a write command to the rewritable non-volatile memory module 106 for writing data thereto. The memory reading circuit is configured to issue a read command to the rewritable non-volatile memory module 106 for reading data therefrom. The memory erasing circuit is configured to issue an erase command to the rewritable non-volatile memory module 106 for erasing data therefrom. The data processing circuit is configured to process data to be written to the rewritable non-volatile memory module 106 or data read from the rewritable non-volatile memory module 106.

The host interface 204 is coupled to the memory management circuit 202 and configured to receive and identify the commands and the data transmitted by the host system 1000. Namely, the commands and data transmitted by the host system 1000 are passed to the memory management circuit 202 through the host interface 204. In the present exemplary embodiment, the host interface 204 complies with the SATA standard. However, it should be understood that the present invention is not limited thereto, and the host interface 204 may comply with the PATA standard, the IEEE 1394 standard, the PCI express standard, the SD standard, the SATA standard, the UHS-I interface standard, the UHS-II interface standard, the MS standard, the MMC standard, the eMMC interface standard, the UFS interface standard, the CF standard, the IDE standard, or other suitable data transmission standards.

The memory interface 206 is coupled to the memory management circuit 202 for accessing the rewritable non-volatile memory module 106. In other words, data to be written into the rewritable non-volatile memory module 106 is converted to an acceptable format for the rewritable non-volatile memory module 106 by the memory interface 206.

In an exemplary embodiment of the present invention, the memory controller 104 further includes a buffer memory 208, a power management circuit 210 and an error checking and correcting circuit 212.

The buffer memory 208 is coupled to the memory management circuit 202 and configured to temporarily store data and commands from the host system 1000 or data from the rewritable non-volatile memory module 106.

The power management circuit 210 is coupled to the memory management circuit 202 and configured to control the power of the memory storage apparatus 100.

The error checking and correcting circuit 212 is coupled to the memory management circuit 202 and configured to perform an error checking and correcting process to assure the accuracy of data. To be more specific, when the memory management circuit 202 receives a write command from the host system 1000, the error checking and correcting circuit 212 generates an error checking and correcting code (ECC code) corresponding to the data of the write command, and the memory management circuit 202 writes the data corresponding to the write command and the corresponding ECC code into the rewritable non-volatile memory module 106. Afterwards, when the memory management circuit 202 reads the data from the rewritable non-volatile memory module 106, the corresponding error checking and correcting code is also be read, and the error checking and correcting circuit 212 executes the error checking and correcting process to the read data according to the ECC code.

Figure 6:
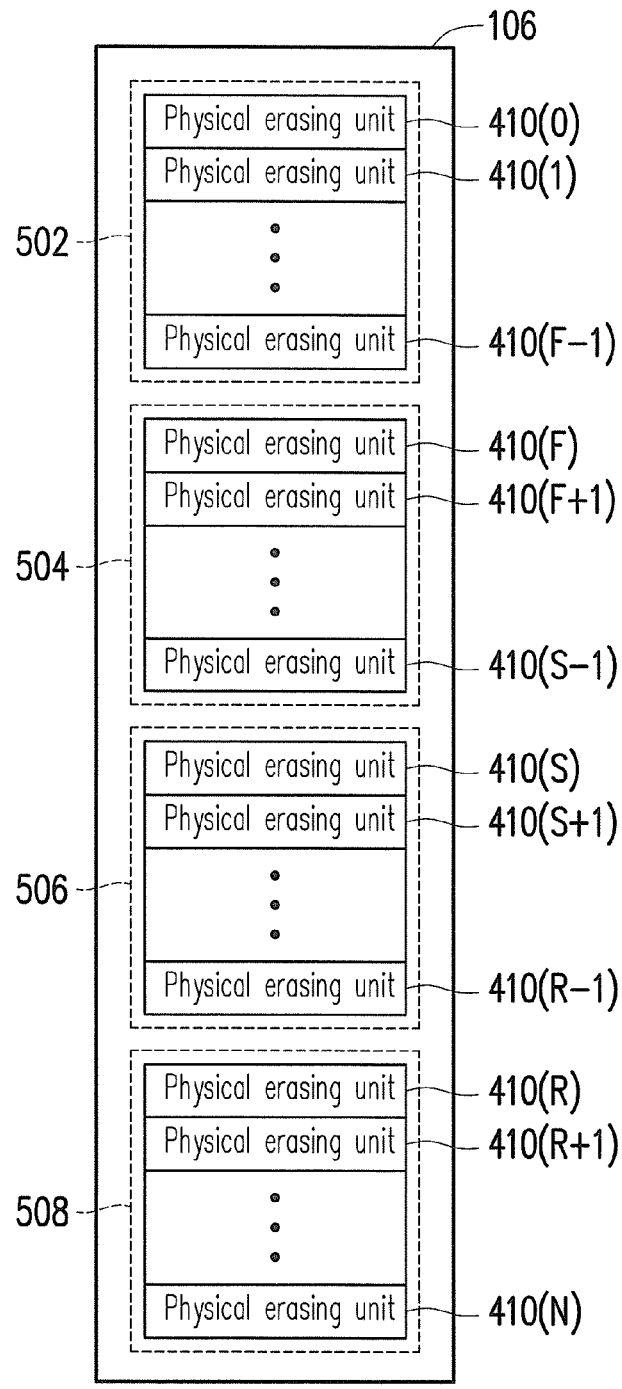
FIG. 6 and FIG. 7 are exemplary diagrams of managing physical erasing units according to an exemplary embodiment of the present invention.
Figure 7:
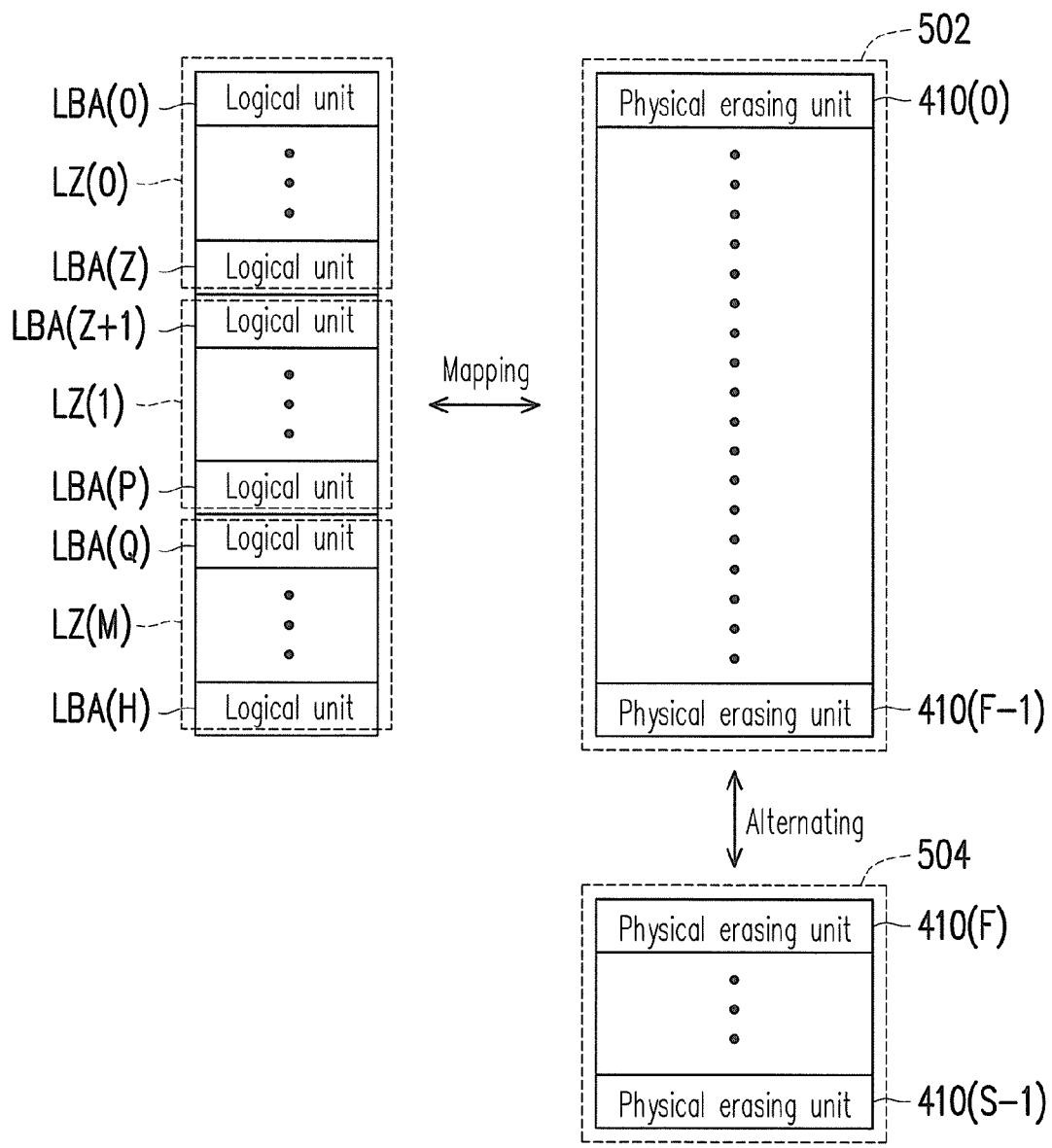
Figure 8:
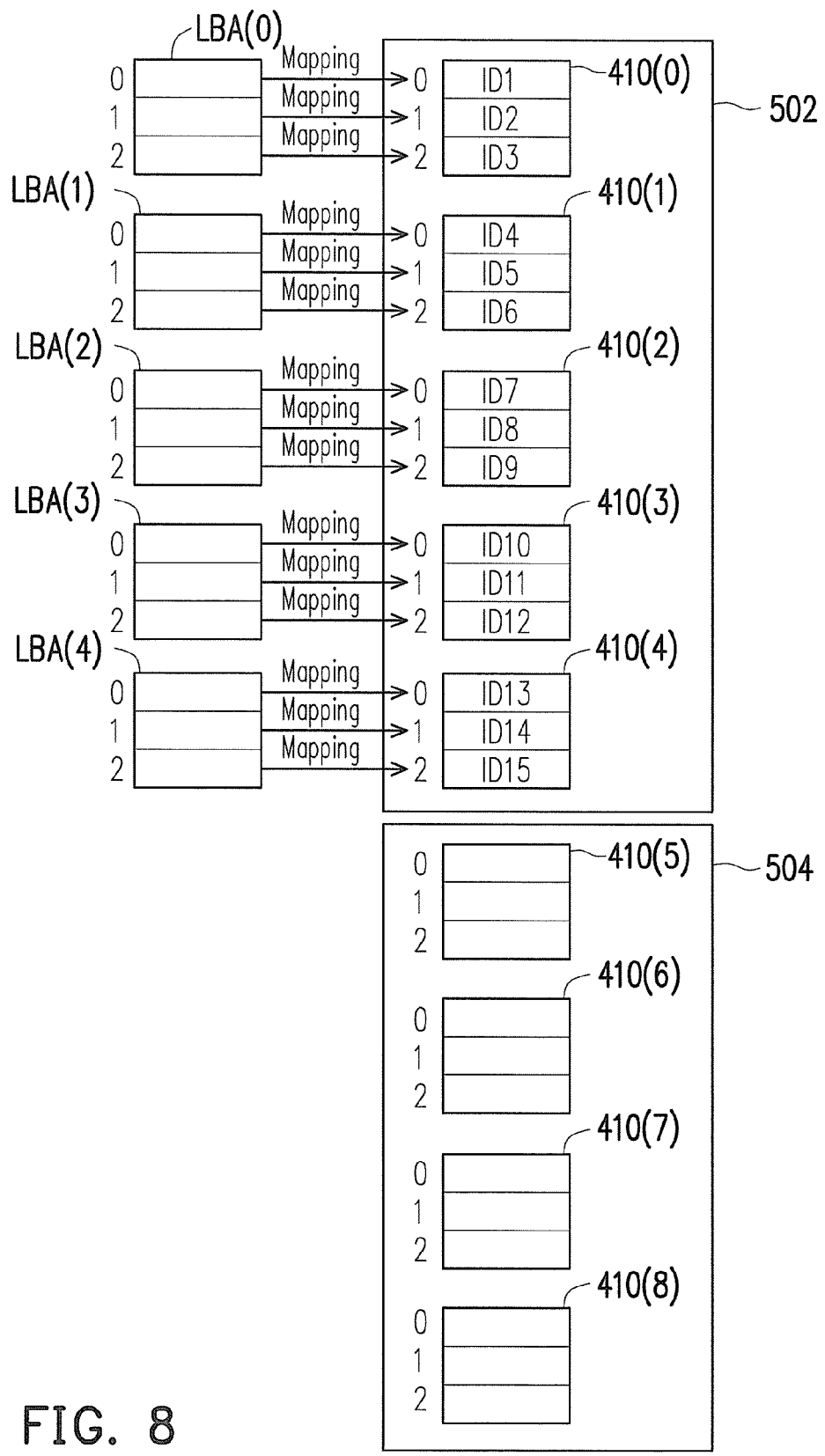
FIGS. 8-14 are the simplified examples of writing data using a global random area.

FIG. 6 and FIG. 7 are exemplary diagrams of managing physical erasing units according to an exemplary embodiment of the present invention.

Referring to FIG. 6, the memory controller 104 (or the memory management circuit 202) logically groups the physical blocks 410(0)~410(N) into a data area 502, a spare area 504, a system area 506, and a replacement area 508.

The physical erasing units logically belonging to the data area 502 and the spare area 504 are used for storing data from the host system 1000. To be specific, the physical erasing units of the data area 502 are the physical erasing units which have been used for storing data, and the physical erasing units of the spare area 504 are the physical erasing units which are used for substituting the physical erasing units of the data area 502. Namely, when a write command and data to be written are received from the host system 1000, the memory management circuit 202 selects a physical erasing unit from the spare area 504 and writes the data into the selected physical erasing unit for substituting the physical erasing units of the data area 502.

The physical erasing units logically belonging to the system area 506 are used for recording system data. For instance, the system data includes the manufacturers and models of the rewritable non-volatile memory module, the number of physical erasing units in the rewritable non-volatile memory modules, the number of physical programming units in each physical erasing unit, and so on.

Physical erasing units logically belonging to the replacement area 508 are used in a bad physical erasing unit replacement procedure for replacing damaged physical erasing units. Particularly, if there are still normal physical erasing units in the replacement area 508, and a physical erasing unit in the data area 502 is damaged, the memory management circuit 202 selects a normal physical erasing unit from the replacement area 508 to replace the damaged physical erasing unit.

In particular, the numbers of physical erasing units in the data area 502, the spare area 504, the system area 506 and the replacement area 508 are various based on different memory module standards. Additionally, it has to be understood that the grouping relationships of grouping the physical erasing units into the data area 502, the spare area 504, the system area 506 and the replacement area 508 are dynamically changed during the operation of the memory storage apparatus 100. For example, when a physical erasing unit in the spare area is damaged and replaced by a physical erasing unit in the replacement area 508, the physical erasing unit in the replacement area 508 is associated with the spare area 504.

Referring to FIG. 7, the memory controller 104 (or the memory management circuit 202) configures a plurality of logical units LBA(0)~LBA(H) for mapping to the physical erasing units of the data area, wherein each logical units includes a plurality of logical pages for mapping to the physical programming units of the corresponding physical erasing units. And, when the host system 1000 is about to write data into a logical unit or update data stored in the logical unit, the memory controller 104 (or the memory management circuit 202) selects a physical erasing unit from the spare area 504 and writes the data into the selected physical erasing unit for substituting the physical erasing units of the data area 502.

In order to identify which physical programming units are used for storing data of each logical unit, in the exemplary embodiment, the memory controller 104 (or the memory management circuit 202) recodes mappings between the logical units and the physical erasing units. And, when the host system 1000 is about to access data at a logical page, the memory controller 104 (or the memory management circuit 202) identifies a logical unit that the logical page belongs to, and therefore accesses data at a physical erasing unit mapping to the logical unit. For example, in the present exemplary embodiment, the memory controller 104 (or the memory management circuit 202) may stores a logical-to-physical address mapping table in the rewritable non-volatile memory module 106 to record physical erasing units mapping to the logical units, and when accessing data, the memory controller 104 (or the memory management circuit 202) loads the logical-to-physical address mapping table to the buffer memory 208 for updating.

It should be noted that the storage space of the buffer memory 208 is limited and can not store a mapping table recording mappings for all of the logical units. In this exemplary embodiment, the memory controller 104 (or the memory management circuit 202) groups the logical units LBA(0)~LBA(H) into a plurality of logical zones LZ(0)~LZ(M) and configures logical-to-physical address mapping tables respectively for the logical zones. In particular, when the memory controller 104 (or the memory management circuit 202) is about to update a mapping for a logical unit, a logical-to-physical address mapping table for a logical zone that the logical unit belongs to is loaded into the buffer memory 208 for updating.

In the present exemplary embodiment, the memory management circuit 202 selects physical erasing units from the spare area 504 as a global random area, and writes data included in the write command from the host system 1000 (also be referred to updated data) into the physical erasing units of the global random area (also be referred to global random physical erasing units). In the present exemplary embodiment, the global random physical erasing unit is designed for storing data corresponding to different logical units respectively.

Specifically, when the memory storage apparatus 100 receives the write command from the host system 1000, the data in the write command from the host system 1000 may be written into the physical erasing unit of the global random area. Also, when the physical erasing unit of the global random area is filled with data, the memory management circuit 202 selects a physical erasing unit from the spare area 504 as another global random physical erasing unit for subsequently writing the updated data corresponding to the write command from the host system 1000. When the number of the physical erasing units of the global random area reaches the upper limit, the memory management circuit 202 performs a data merging operation for invalidating the data stored in the global random physical erasing units, and associates the global random physical erasing units storing the invalid data with the spare area 504.

FIGS. 8-14 are the simplified examples of writing data using a global random area.

In order to explain easily, here it is assumed that the data area 502 includes
physical erasing units. The spare area 504 includes 4 physical erasing units, each physical erasing unit includes 3 physical programming units, data to be written in each physical programming unit must be written according to the order of the physical programming units, and the upper limit of the number of the physical erasing units that are serving as the global random physical erasing units is 2.

Referring to 8, in the initial status of the memory storage apparatus 100, the logical pages of the logical units LBA(0)~LBA(4) orderly map to the physical programming units of the physical erasing units 410(0)~410(4) in the data area 502, and the spare area 504 includes a plurality of physical erasing units 410(5)~410(8). Namely, the memory controller 104 (or the memory management circuit 202) records the mapping relationship between the logical units LBA(0)~LBA(4) and the physical erasing units 410(0)~410(4) in the logical-to-physical address mapping table, and considers that the physical programming units of the physical erasing units 410(0)~410(4) have stored data belonging to the logical pages of the logical units LBA(0)~LBA(4) (i.e. initial data ID1~ID15). It should be noted that, when the memory storage apparatus 100 is manufactured in the factory, the initial data ID1~ID15 may be null. Furthermore, the memory management circuit 202 records the usable physical erasing units 410(5)~410(8) in the spare area 504.

Referring to 9, if updated data UD1 is to be programmed and the updated data UD1 belongs to a first logical page of the logical unit LBA(0), the memory controller 104 (or the memory management circuit 202) selects a physical erasing unit 410(5) from the spare area 504 as a physical erasing unit for a global random area 550 and issues a program command to write the updated data UD1 into a zeroth physical programming unit of the physical erasing unit 410(5).

Figure 9:
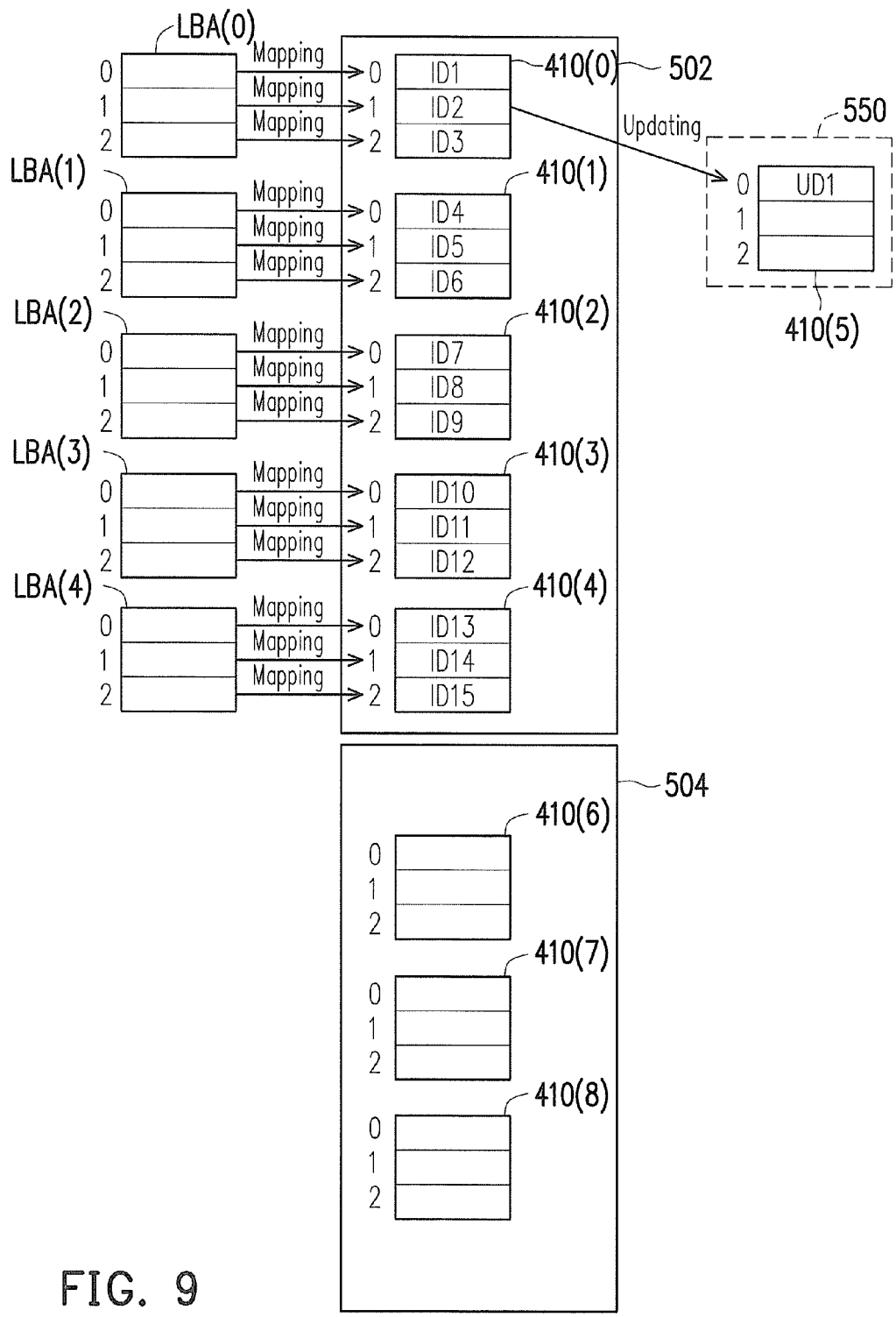
Figure 10:
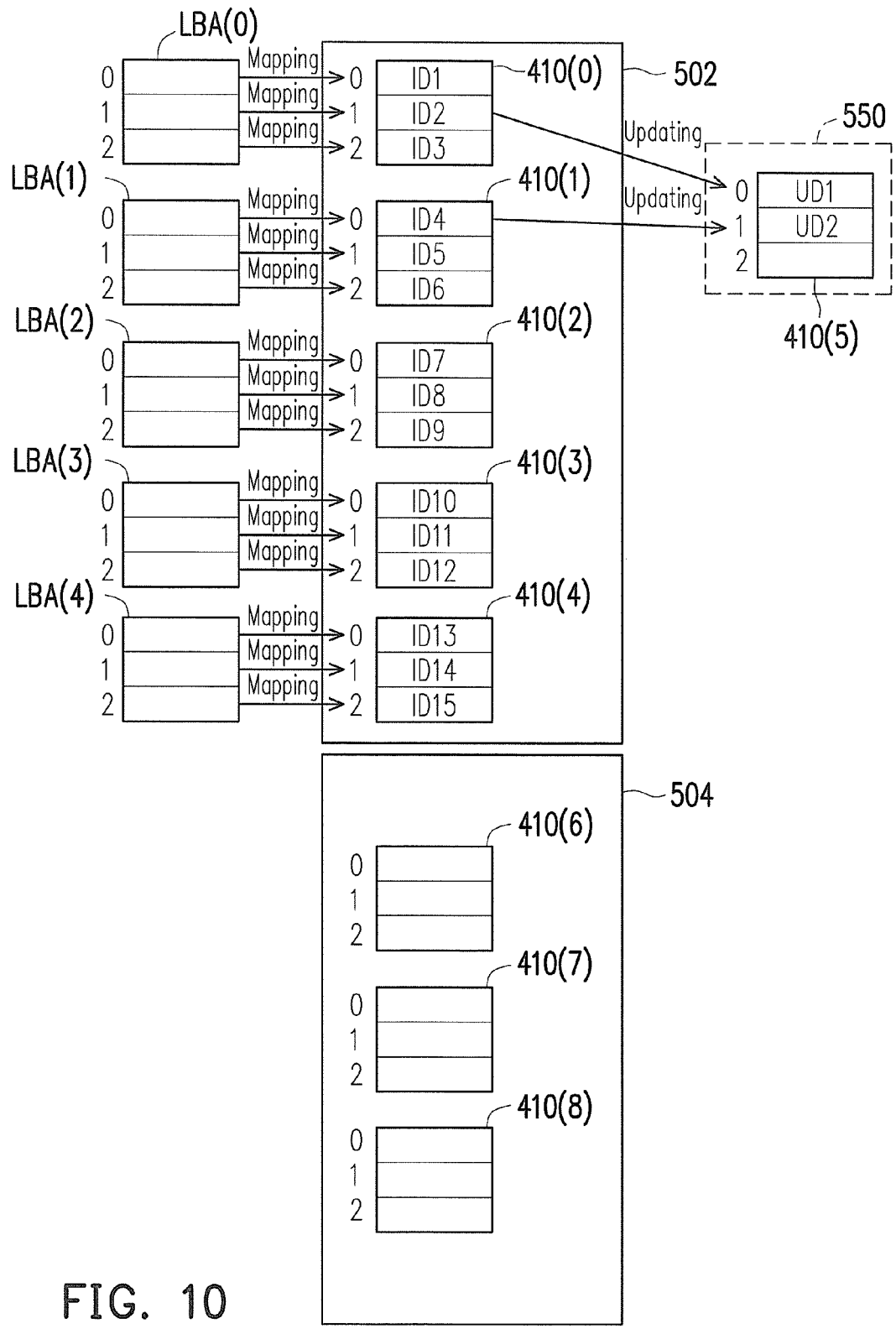

Referring to FIG. 10, if updated data UD2 is to be programmed following the status shown in FIG. 9 and the updated data UD2 belongs to a zeroth logical page of the logical unit LBA(1), the memory controller 104 (or the memory management circuit 202) issues a program command to write the updated data UD2 into a first physical programming unit of the physical erasing unit 410(5).

Figure 11:
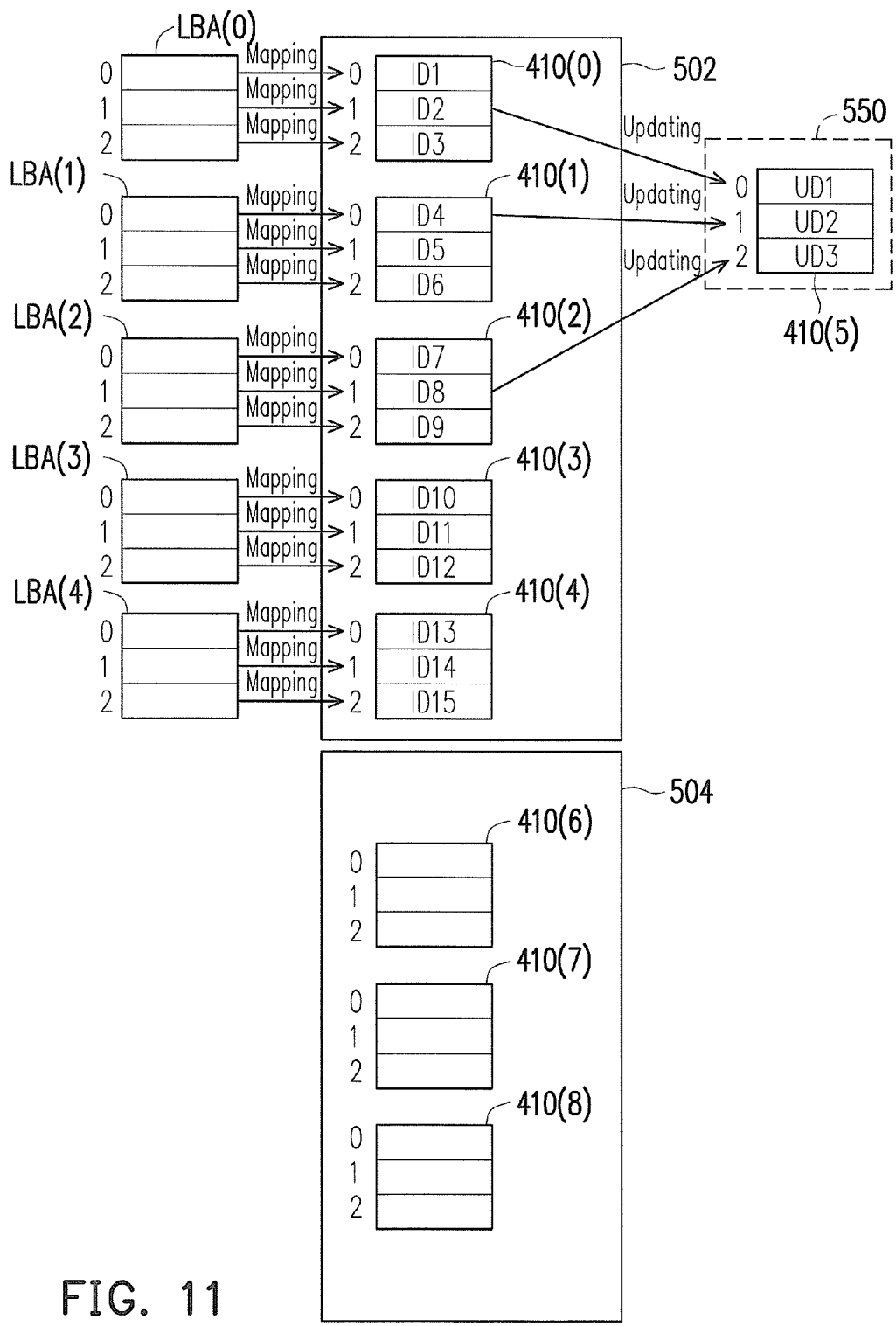

Referring to FIG. 11, if updated data UD3 is to be programmed following the status shown in FIG. 10 and the updated data UD3 belongs to the first logical page of the logical unit LBA(2), the memory controller 104 (or the memory management circuit 202) issues a program command to write the updated data UD3 into a second physical programming unit of the physical erasing unit 410(5).

Figure 12:
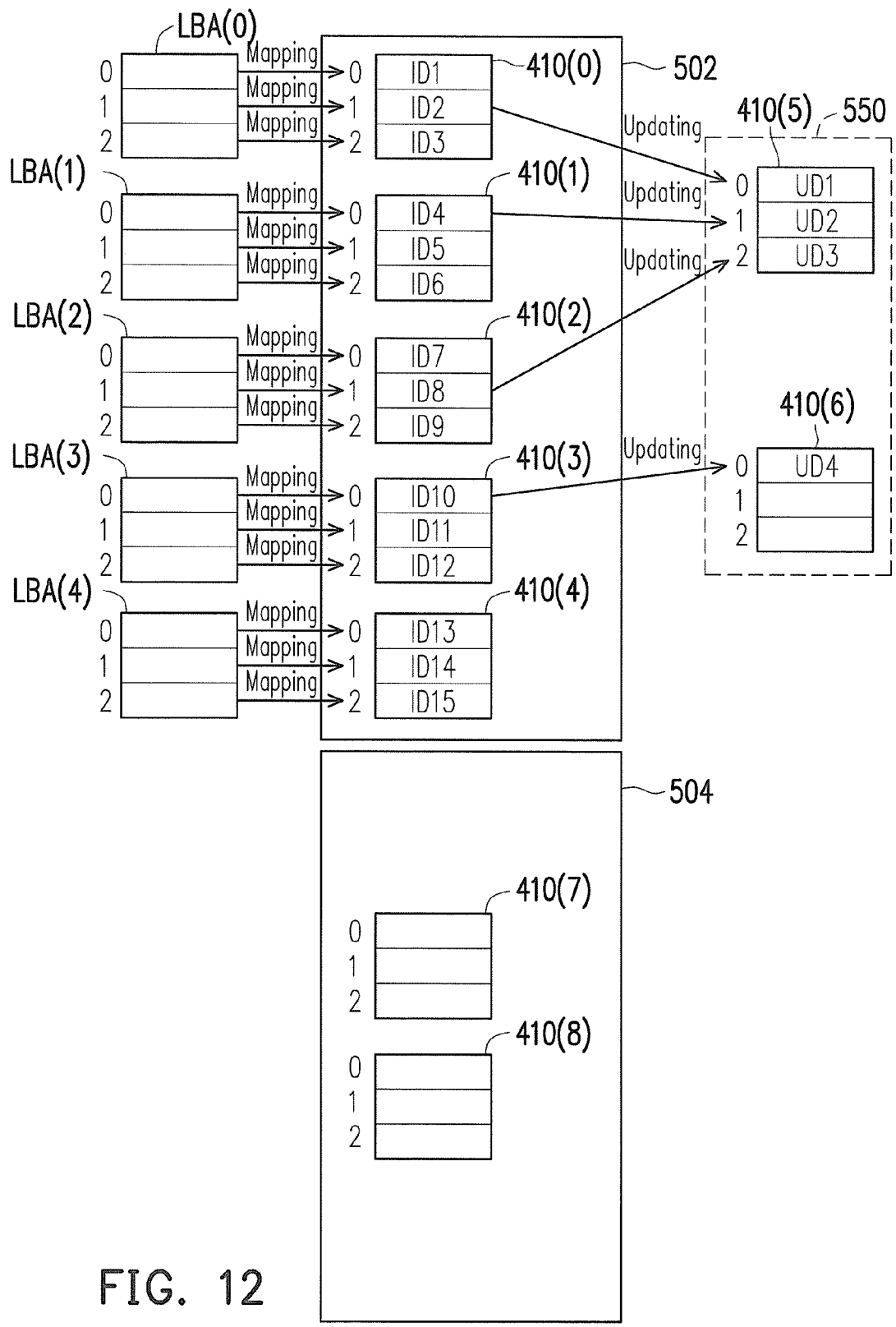

Referring to FIG. 12, if updated data UD4 is to be programmed following the status shown in FIG. 11 and the updated data UD4 belongs to the zeroth logical page of the logical unit LBA(3), because the global random physical erasing unit 410(5) does not have any storage space for storing the updated data UD4, the memory controller 104 (or the memory management circuit 202) selects a physical erasing unit 410(6) as another physical erasing unit for the global random area 550 and issues a program command to write the updated data UD4 into the zeroth physical programming unit of the physical erasing unit 410(6).

Figure 13:
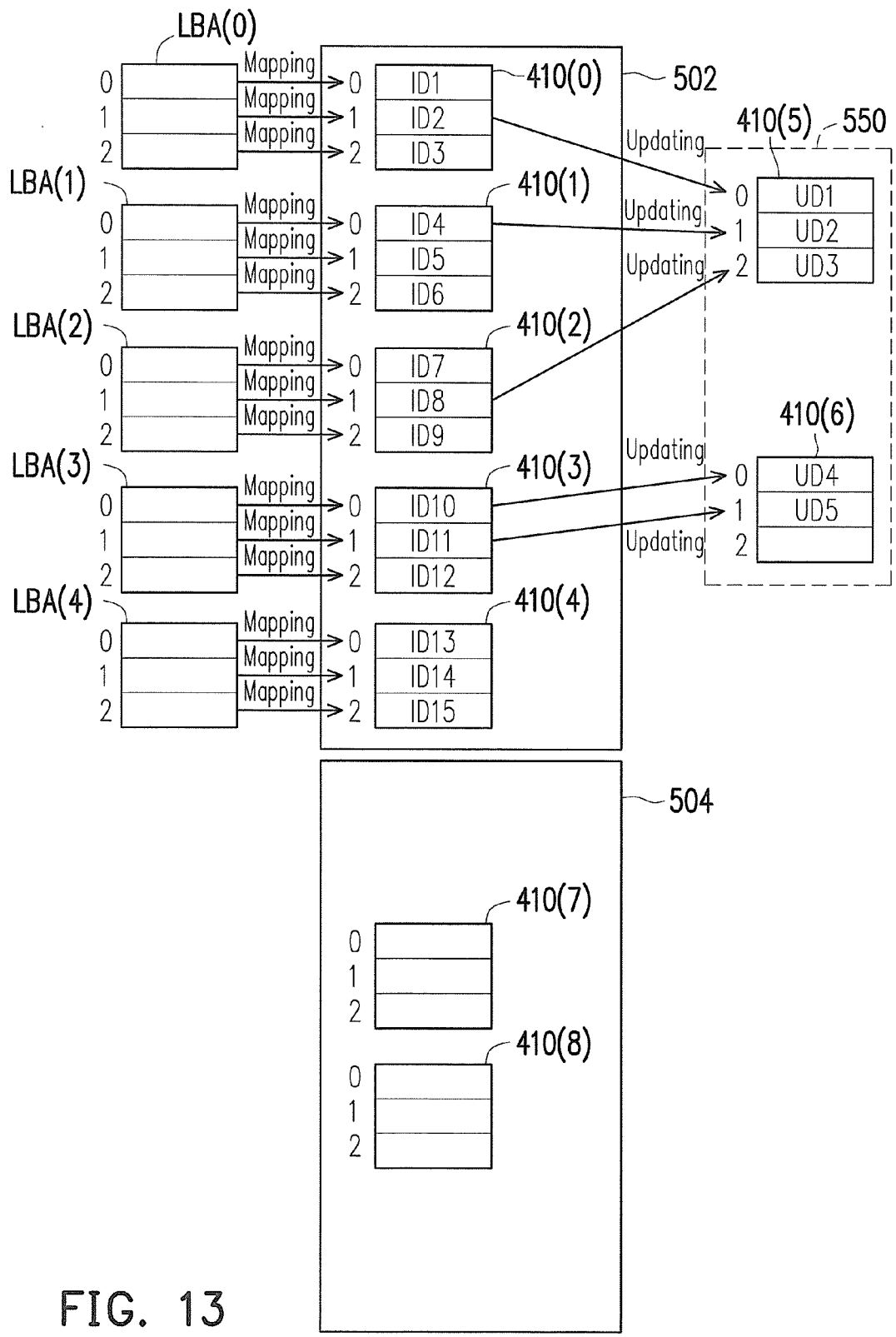

Referring to FIG. 13, if updated data UD5 is to be programmed following the status shown in FIG. 12 and the updated data UD5 belongs to the first logical page of the logical unit LBA(3), the memory controller 104 (or the memory management circuit 202) issues a program command to write the updated data UD3 into a first physical programming unit of the physical erasing unit 410(6).

Figure 14:
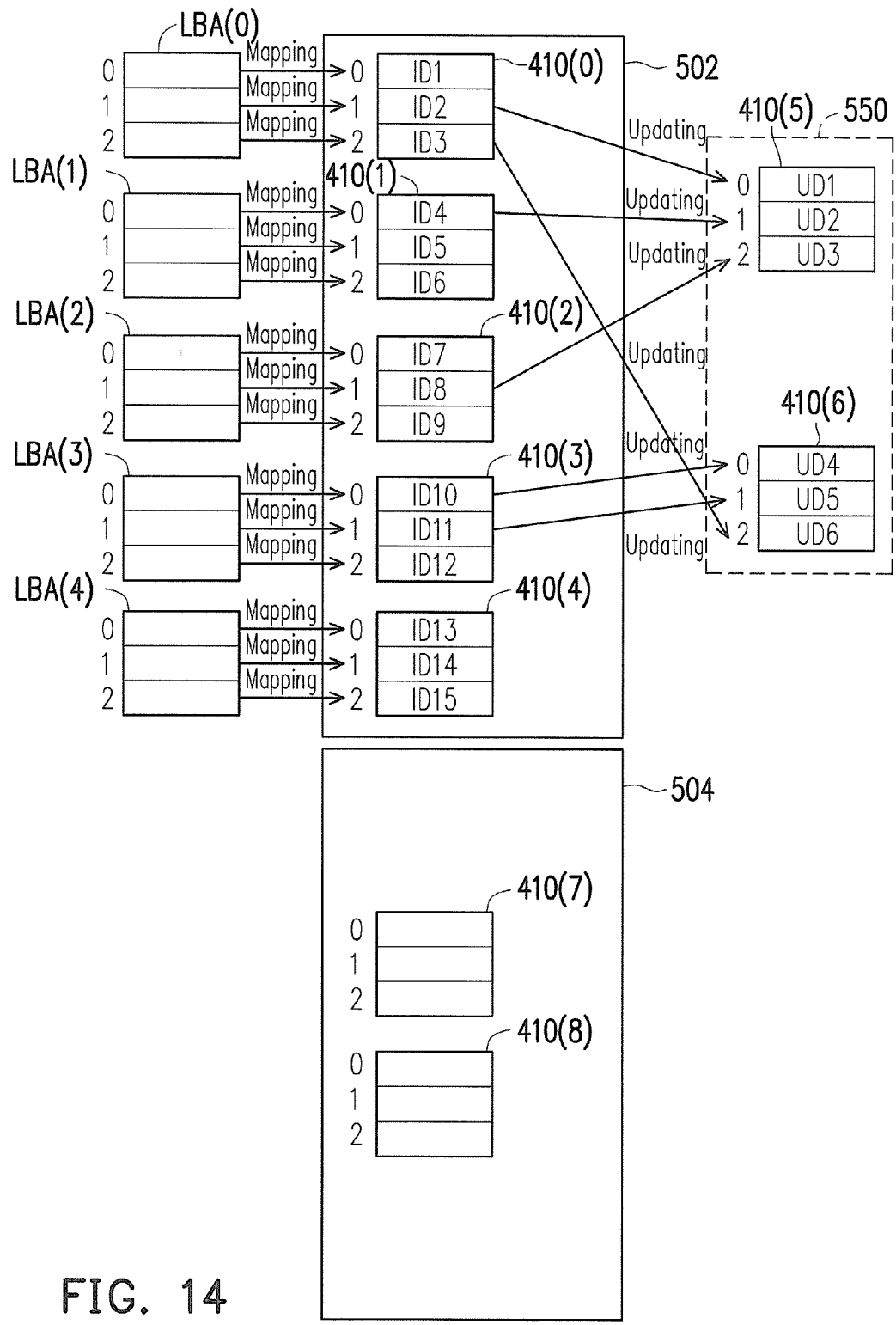

Referring to FIG. 14, if updated data UD6 is to be programmed following the status shown in FIG. 13 and the updated data UD6 belongs to a second logical page of the logical unit LBA(0), the memory controller 104 (or the memory management circuit 202) issues a program command to write the updated data UD6 into a second physical programming unit of the physical erasing unit 410(6).

To be able to identify the logical pages (i.e. updated logical pages) of the logical units (i.e. updated logical units) that the data stored in the physical erasing units of the global random area belongs to, in the present exemplary embodiment, the memory controller 104 (or the memory management circuit 202) builds a global random area searching table to search the data effectively. Here, the logical pages which the updated data temporarily stored in the global random area belong to are referred to as updated logical pages and the logical units which the updated logical pages belong to are referred to as updated logical units. In the global random area searching table, the memory controller 104 (or the memory management circuit 202) builds a plurality of root units and configures an entry link for each root unit. Particularly, the memory controller 104 (or the memory management circuit 202) groups the logical pages of the logical units for corresponding to each of the root units and records the updated data of the updated logical pages on the entry links of the corresponding root units. Therefore, when the updated data of a logical unit is to be searched in the global random physical erasing unit, only searching for the entry link of the corresponding root unit is needed.

For instance, in the present exemplary embodiment, the memory controller 104 (or the memory management circuit 202) respectively groups the logical pages of each logical unit into the same root unit. Namely, the logical pages in the same logical unit correspond to the same root unit. It is noted that, the present invention is not limited thereto, for example, in another exemplary embodiment, a part of the logical pages in a logical unit may be grouped into a root unit and another part of the logical pages of the logical unit may be grouped into another root unit.

Additionally, the memory controller 104 (or the memory management circuit 202) sets an entry link for each root unit and when executing a write command, the memory controller 104 (or the memory management circuit 202) builds an entry on the corresponding entry link for recording the updated data of the write command. For instance, each entry includes a first field (such as field 902 in FIG. 15), a second field (such as field 904 in FIG. 15) and a third field (such as field 906 in FIG. 15), wherein the first field records the address of the updated logical page, the second field records the physical address storing the updated data of the updated logical page, and the third field marks whether the entry is valid or not. Here, if the entry is valid, the third field, for example, is marked as '1'; and if the entry is invalid, the third field, for example, is marked as '0'. It is noted that, the way of marking the valid entry and the invalid entry is not limited thereto. For example, '1' may be used for indicating that the entry is invalid and '0' may be used for indicating that the entry is valid.

Figure 15:
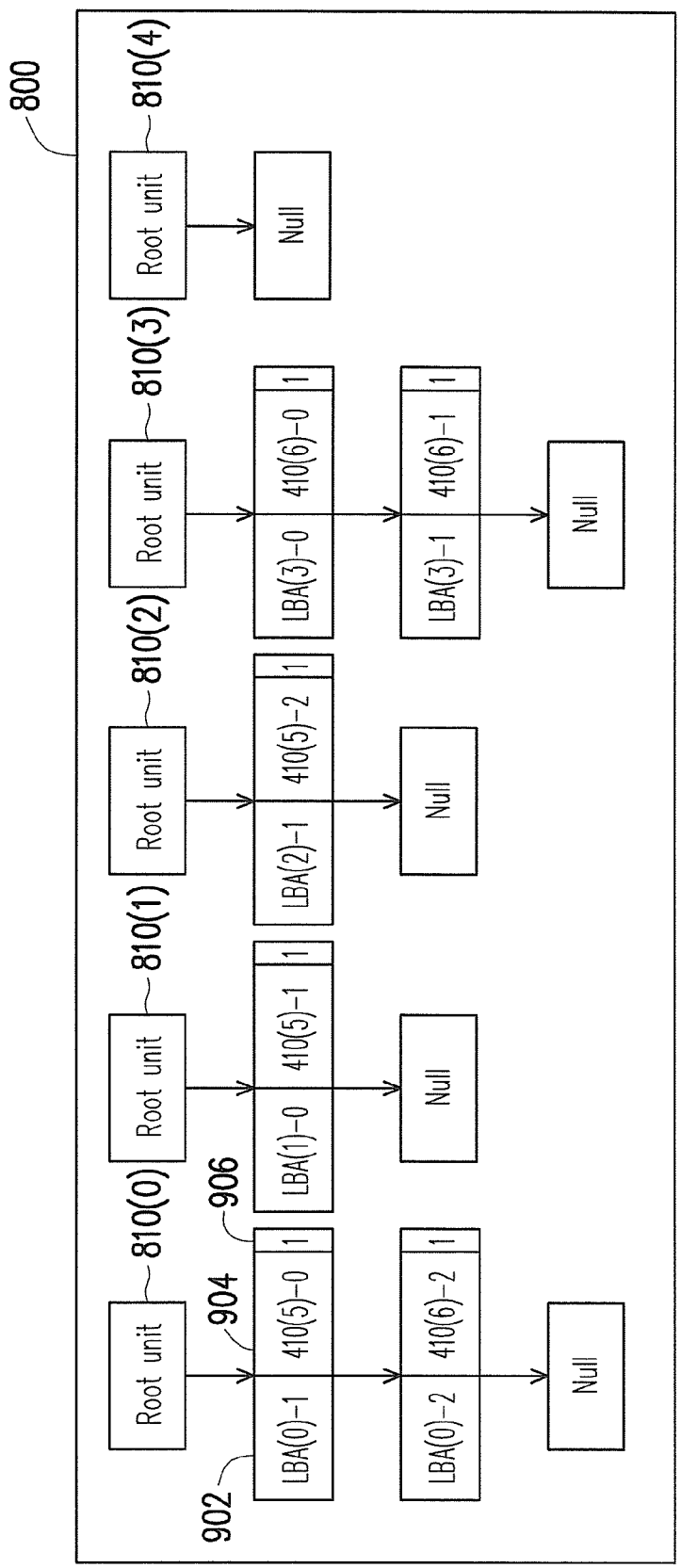
FIG. 15 is the simplified example of a global random area searching table according to FIG. 14.

FIG. 15 is the simplified example of a global random area searching table according to FIG. 14.

Referring to FIG. 15, a global random area searching table 800 includes root units 810(0)-810(4), wherein the logical pages of the logical unit LBA(0) correspond to the root unit 810(0), the logical pages of the logical unit LBA(1) correspond to the root unit 810(1), the logical pages of the logical unit LBA(2) correspond to the root unit 810(2), the logical pages of the logical unit LBA(3) correspond to the root unit 810(3), and the logical pages of the logical unit LBA(4) correspond to the root unit 810(4).

The entry link of the root unit 810(0) includes 2 valid entries to record that a first logical page (i.e. information "LBA(0)-1") and a second logical page (i.e. information "LBA(0)-2") of the logical unit LBA(0) have been updated, wherein the updated data of the first logical page of the logical unit LBA(0) is written into the zeroth physical programming unit of the physical erasing unit 410(5) (i.e. information "410(5)-0") and the updated data of the second logical page of the logical unit LBA(0) is written into the second physical programming unit of the physical erasing unit 410(6) (i.e. information "410(6)-2").

The entry link of the root unit 810(1) includes one valid entry to record that the zeroth logical page of the logical unit LBA(1) (i.e. information "LBA(1)-0") has been updated, wherein the updated data of the zeroth logical page of the logical unit LBA(1) is written into the first physical programming unit of the physical erasing unit 410(5) (i.e. information"410(5)-1").

The entry link of the root unit 810(2) includes one valid entry to record that the first logical page of the logical unit LBA(2) (i.e. information "LBA(2)-1") has been updated, wherein the updated data of the first logical page of the logical unit LBA(2) is written into the second physical programming unit of the physical erasing unit 410(5) (i.e. information"410(5)-2").

The entry link of the root unit 810(3) includes 2 valid entries to record that a zeroth logical page (i.e. information "LBA(3)-0") and a first logical page (i.e. information "LBA(3)-1") of the logical unit LBA(3) have been updated, wherein the updated data of the zeroth logical page of the logical unit LBA(3) is written into the zeroth physical programming unit of the physical erasing unit 410(6) (i.e. information "410(6)-0") and the updated data of the first logical page of the logical unit LBA(3) is written into the first physical programming unit of the physical erasing unit 410(6) (i.e. information "410(6)-1").

Additionally, the entry links of the root units 810(0)-810(4) respectively includes a null entry to represent the end of the entry links. For instance, when the data belonging to the logical unit LBA(4) is to be searched in the global random physical erasing unit, the memory controller 104 (or the memory management unit 202) may identify that there is no data belonging to the logical unit LBA(4) in the global random physical erasing units based on the entry link of the root unit 810(4), which only has the null entry, thereby reading the data from the physical programming units of the corresponding physical erasing unit according to the information of the logical-to-physical address mapping table.

By the same token, the memory controller 104 (or the memory management circuit 202) orderly writes data to be stored in the host system 1000 into the physical erasing units severed as the global random area. Particularly, when the number of the physical erasing units severed as the global random area reaches 3, the memory controller 104 (or the memory management circuit 202) executes a data merging operation while executing a write command to prevent the physical erasing units of the spare area from exhausting.

FIGS. 16-21 are the simplified examples of performing a valid data merging operation for the global random area to execute next write command.

Figure 16:
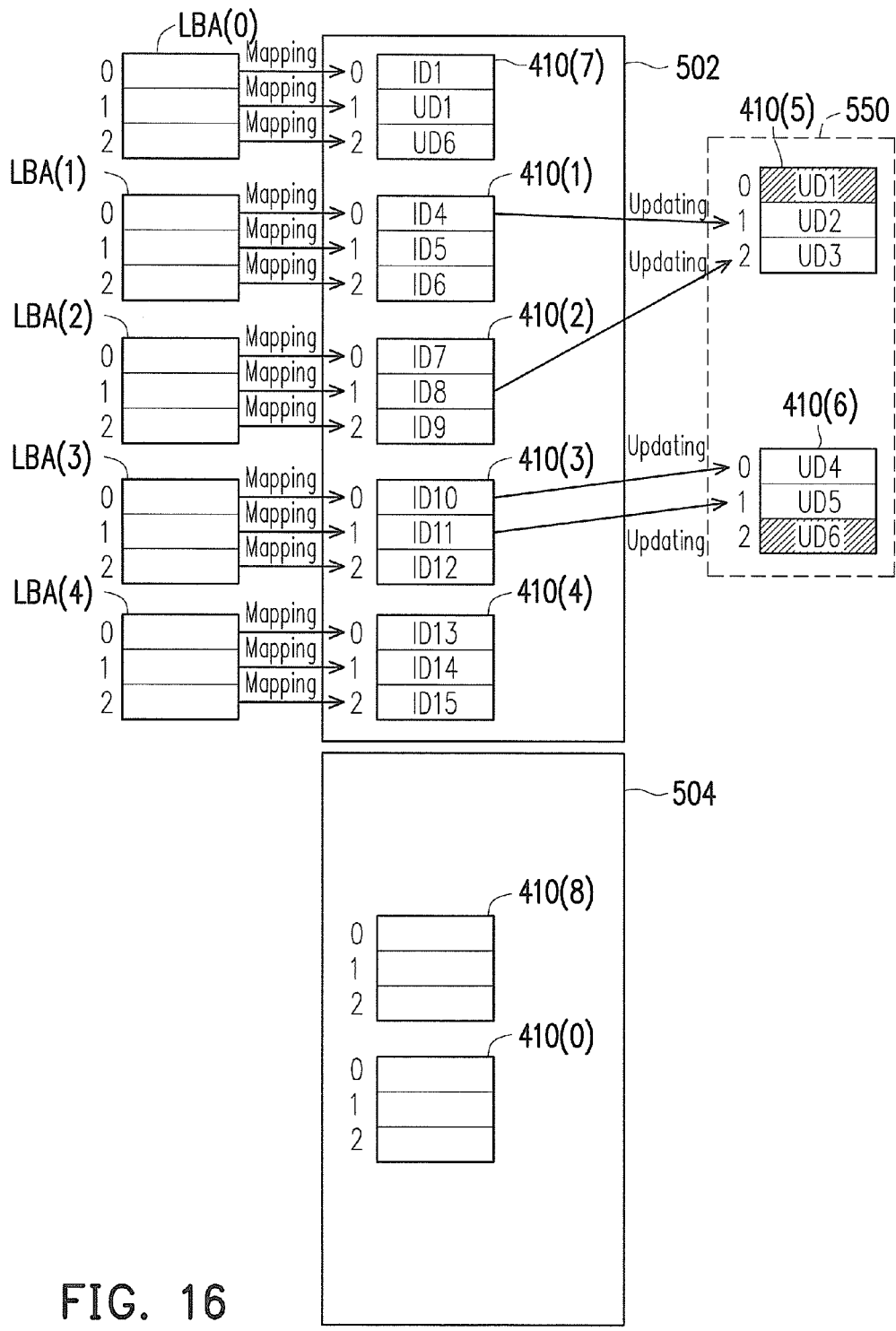
FIGS. 16-21 are the simplified examples of performing a valid data merging operation for the global random area to execute next write command.

Referring to FIG. 16, if updated data UD7 is to be programmed following the status shown in FIG. 14 and the updated data UD7 belongs to the zeroth logical page of the logical units LBA(2), because the global random physical erasing unit 410(6) does not have any storage space for storing the updated data UD7 and the number of the physical erasing units served as the global random area 550 reaches 2, the memory controller 104 (or the memory management circuit 202) performs a data merging operation before writing the updated data UD7. Namely, in this example, while executing the writing command, the memory controller 104 (or the memory management circuit 202) executes the data merging operation.

For example, first, the memory controller 104 (or the memory management circuit 202) selects the logical unit LBA(0) to perform the data merging operation. At this time, the memory controller 104 (or the memory management circuit 202) identifies that the logical unit LBA(0) maps to the physical erasing unit 410(0), selects the physical erasing unit 410(7) from the spare area 504, and copies valid data belonging to logical unit LBA(0) from the physical erasing unit 410(0) and the global random area 550 to the physical erasing unit 410(7). In detail, the memory controller 104 (or the memory management circuit 202) orderly writes the data ID 1 in the physical erasing unit 410(0), the data UD1 in the physical erasing unit 410(5) and the data UD6 in the physical erasing unit 410(6) into the zeroth~second physical programming units of the physical erasing unit 410(7) and marks the zeroth physical programming unit of the physical erasing unit 410(5) and the second physical programming unit of the physical erasing unit 410(6) as invalid programming units (as shown in oblique lines). Afterwards, the memory controller 104 (or the memory management circuit 202) executes an erase operation on the physical erasing unit 410(0), re-maps the logical unit LBA(0) to the physical erasing unit 410(7) in the logical-to-physical address mapping table, and associates the physical erasing unit 410(0) with the spare area 504.

Figure 17:
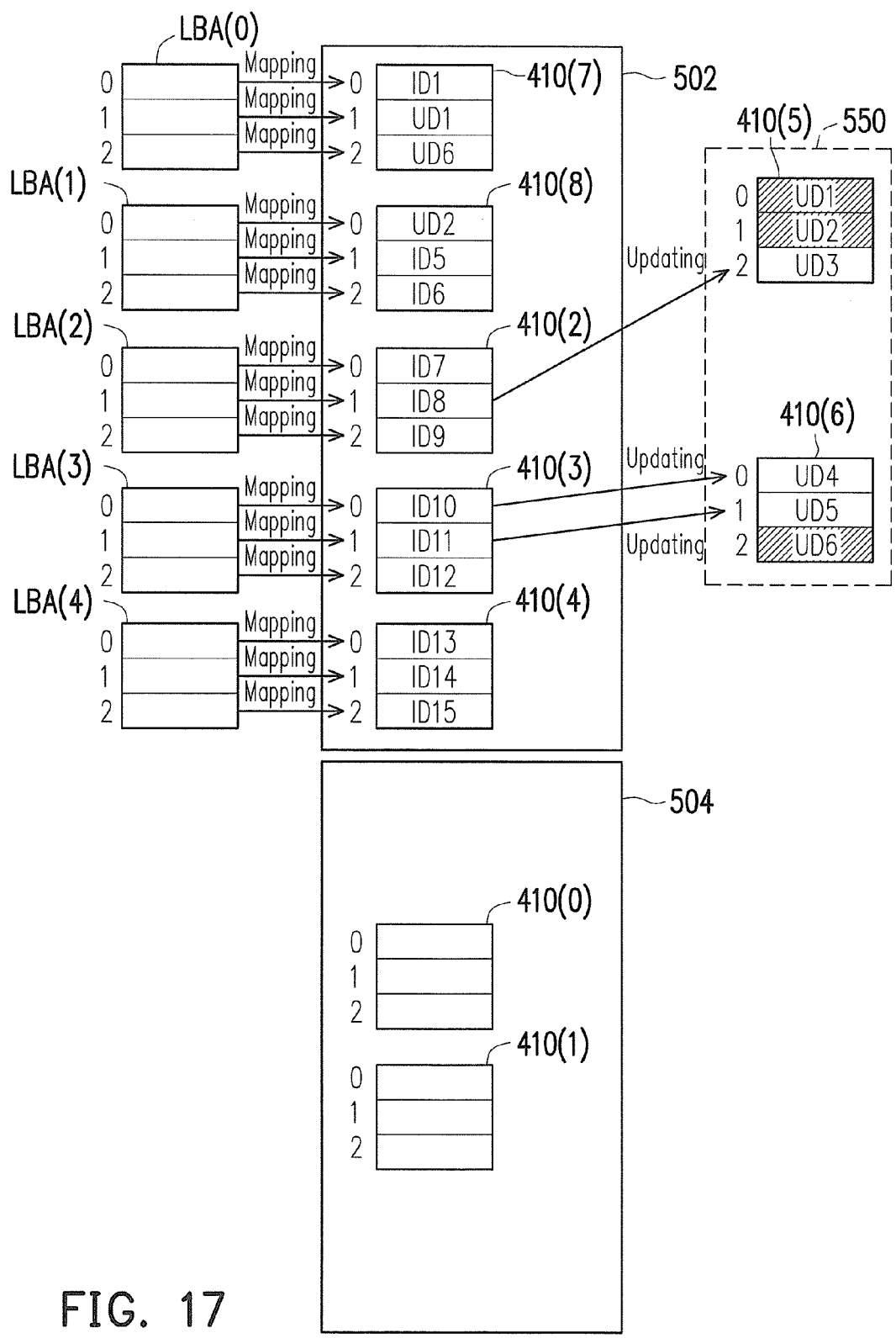

Referring to FIG. 17, then, the memory controller 104 (or the memory management circuit 202) selects the logical unit LBA(1) to perform the data merging operation. At this time, the memory controller 104 (or the memory management circuit 202) identifies that the logical unit LBA(1) maps to the physical erasing unit 410(1), selects the physical erasing unit 410(8) from the spare area 504, and copies valid data belonging to logical unit LBA(1) from the physical erasing unit 410(1) and the global random area 550 to the physical erasing unit 410(8). Afterwards, the memory controller 104 (or the memory management circuit 202) executes the erase operation on the physical erasing unit 410(1), re-maps the logical unit LBA(1) to the physical erasing unit 410(8) in the logical-to-physical address mapping table, and associates the physical erasing unit 410(1) with the spare area 504.

Figure 18:
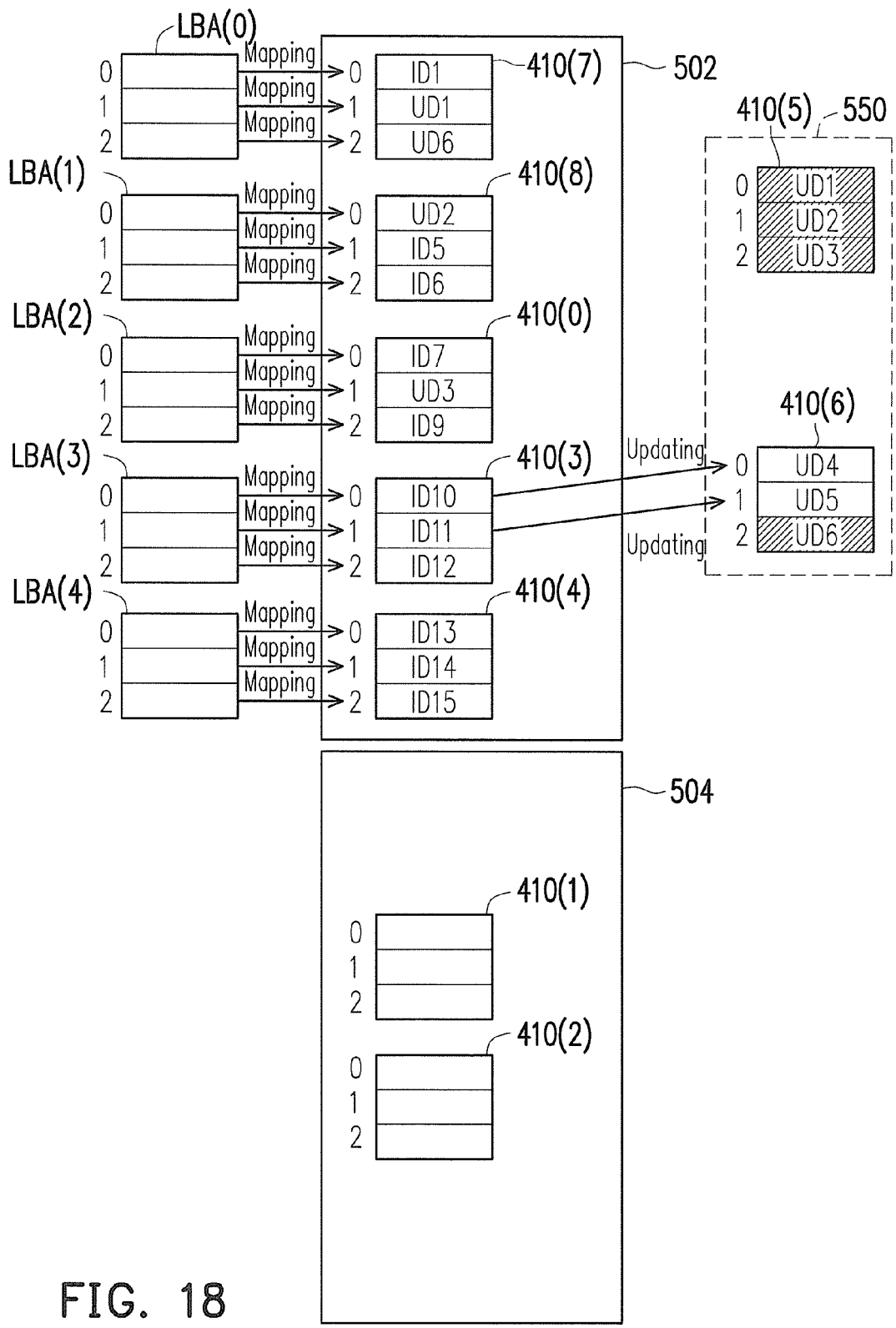

Referring to FIG. 18, then, the memory controller 104 (or the memory management circuit 202) selects the logical unit LBA(2) to perform the data merging operation. At this time, the memory controller 104 (or the memory management circuit 202) identifies that the logical unit LBA(2) maps to the physical erasing unit 410(2), selects the physical erasing unit 410(0) from the spare area 504, and copies valid data belonging to logical unit LBA(2) from the physical erasing unit 410(2) and the global random area 550 to the physical erasing unit 410(0). Afterwards, the memory controller 104 (or the memory management circuit 202) executes the erase operation on the physical erasing unit 410(2), re-maps the logical unit LBA(2) to the physical erasing unit 410(0) in the logical-to-physical address mapping table, and associates the physical erasing unit 410(2) with the spare area 504.

Figure 19:
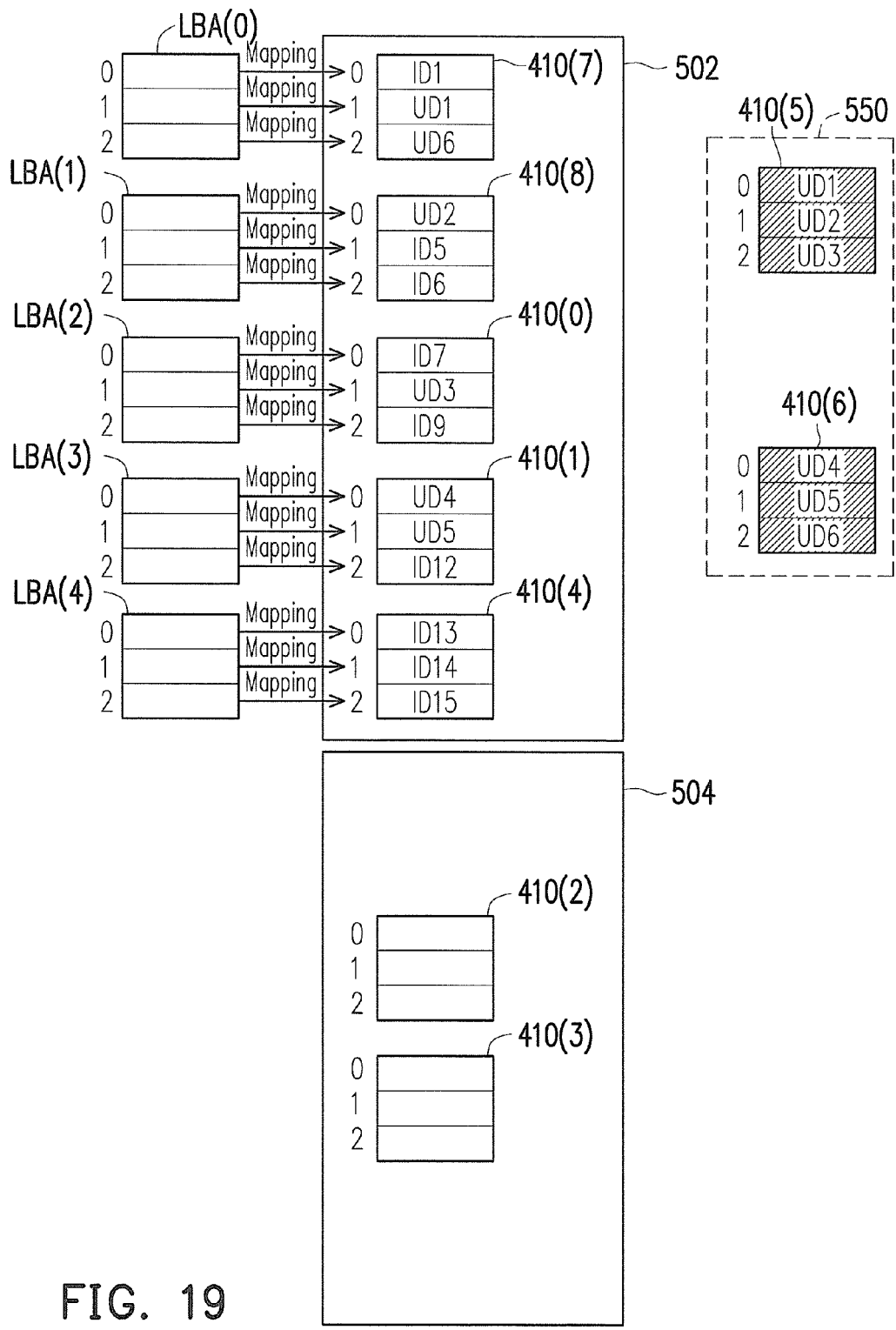

Referring to FIG. 19, then, when the memory controller 104 (or the memory management circuit 202) selects the logical unit LBA(3) to perform the data merging operation, the memory controller 104 (or the memory management circuit 202) identifies that the logical unit LBA(3) maps to the physical erasing unit 410(3), selects the physical erasing unit 410(0) from the spare area 504, and copies valid data belonging to logical unit LBA(3) from the physical erasing unit 410(3) and the global random area 550 to the physical erasing unit 410(1). Afterwards, the memory controller 104 (or the memory management circuit 202) executes the erase operation on the physical erasing unit 410(3), re-maps the logical unit LBA(3) to the physical erasing unit 410(1) in the logical-to-physical address mapping table, and associates the physical erasing unit 410(3) with the spare area 504.

Figure 20:
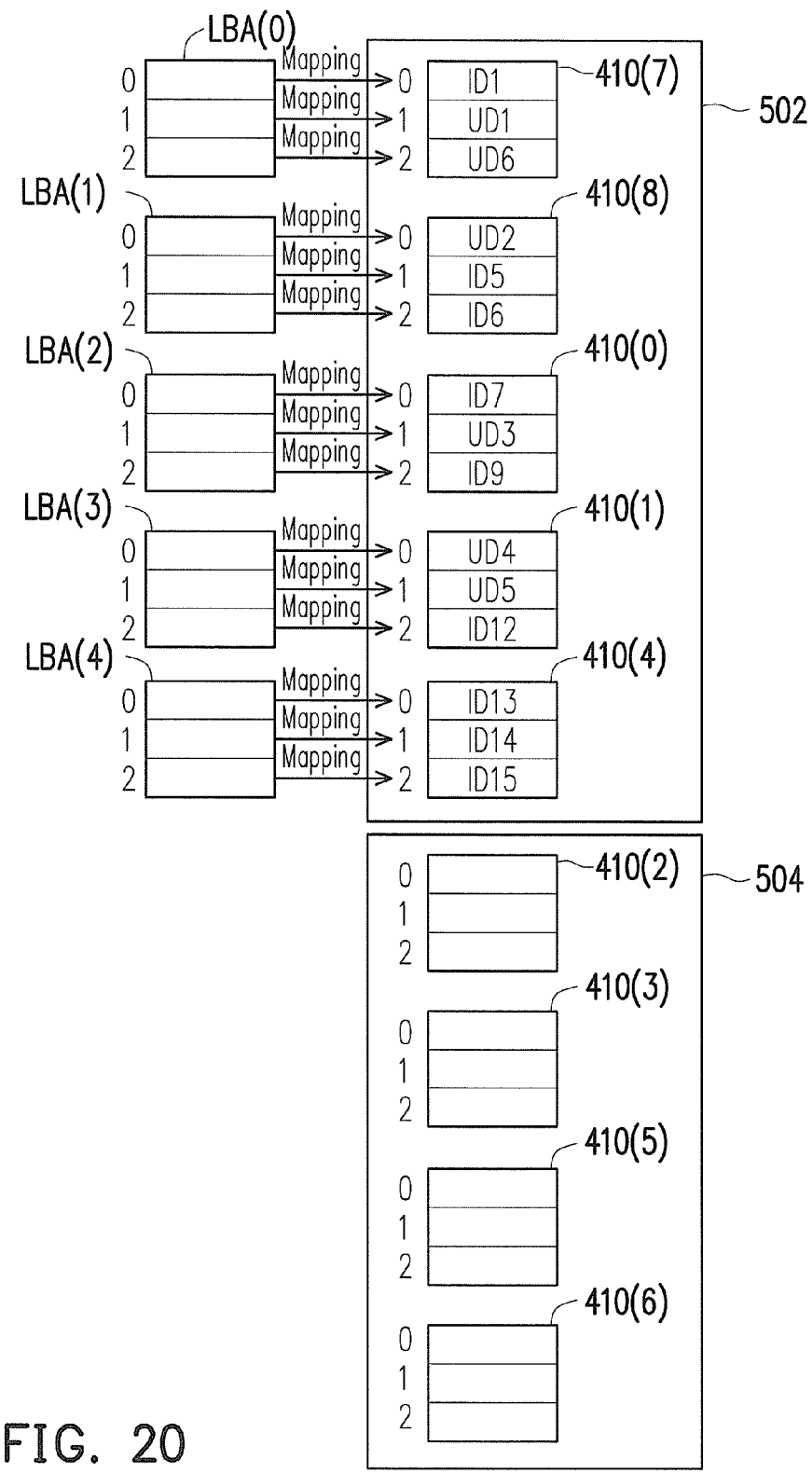
Figure 21:
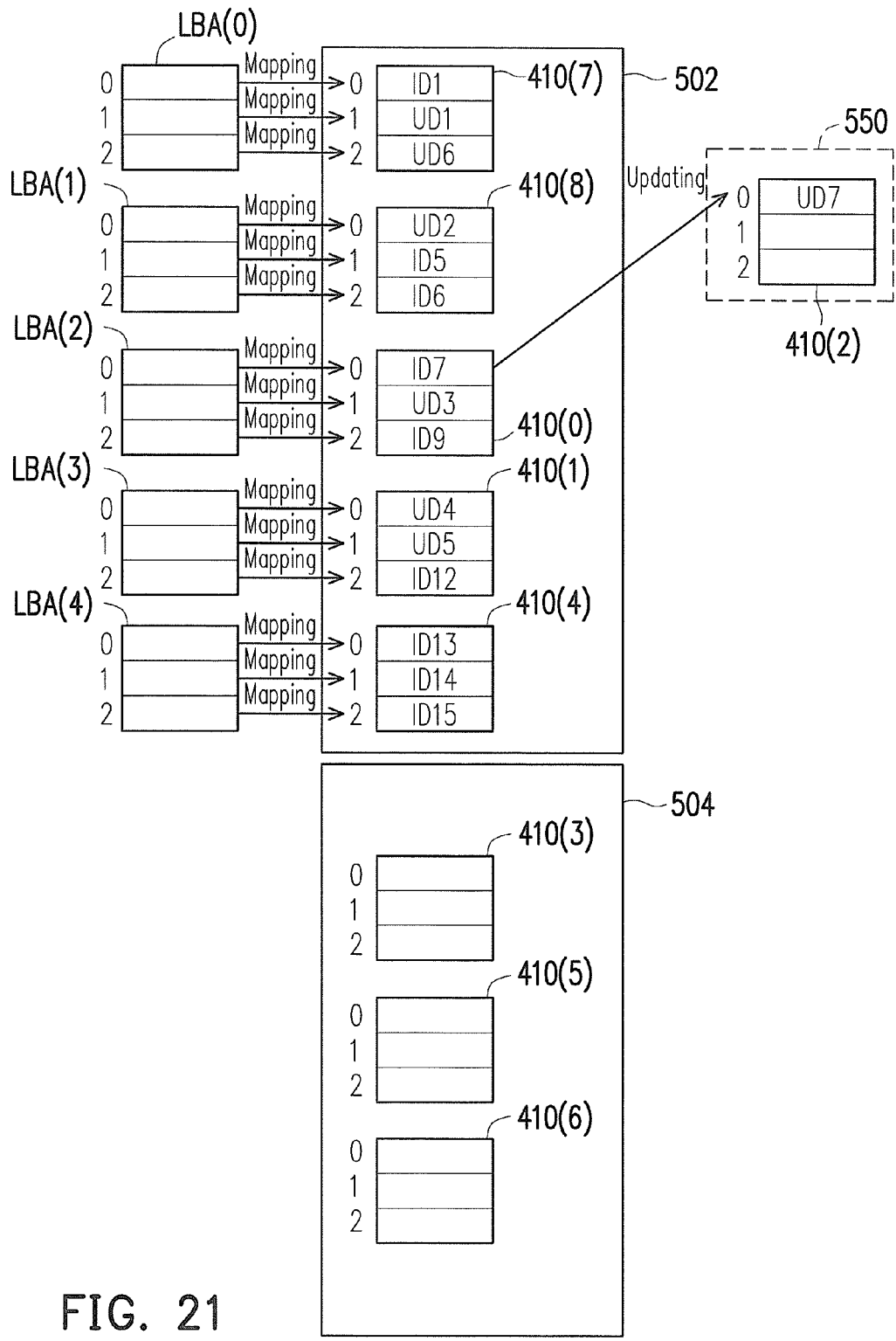

In particular, at this time, data stored in the physical erasing units of the global random area 550 is invalid, and therefore the memory controller 104 (or the memory management circuit 202) performs the erasing operation on the physical erasing units 410(5) and 410(6) and associates the erased physical erasing units 410(5) and 410(6) with spare area 504 (as shown in FIG. 20), thereby completing the valid data merging operation for the global random area 550.

Referring to 21, after the valid data merging operation for the global random area 550, the memory controller 104 (or the memory management circuit 202) selects a physical erasing unit 410(2) from the spare area 504 as a physical erasing unit for the global random area 550 and issues a program command to write the updated data UD7 into a zeroth physical programming unit of the physical erasing unit 410(2).

Accordingly, based on the mentioned operation, the memory controller 104 (or the memory management circuit 202) restores valid data stored in the physical erasing units of the global random area 550 into the physical erasing units mapped to the logical units, associates the global random physical erasing unit only storing invalid data with the spare area 504 and selects an empty physical erasing unit as a global random physical erasing unit, thereby preventing the number of global random physical erasing units in the global random area from exceeding the upper limit.

It should be noted that as described above, when the data merging operation is performed, the memory controller 104 (or the memory management circuit 202) may merge valid data belonging to different logical units and update the logical-to-physical address table. In particular, if the storage space of the buffer memory 208 is limited and only a portion of the logical-to-physical address tables is loaded into the buffer memory 208, the memory controller 104 (or the memory management circuit 202) needs to load and restore different logical-to-physical address tables for many times for performing the data merging operation, such that a delay for executing a write command is generated. Accordingly, in the present exemplary embodiment, the memory controller 104 (or the memory management circuit 202) may record a data dispersedness degree corresponding to the global random area 550 and determine whether the data dispersedness degree corresponding to the global random area 550 is smaller than a data dispersedness degree threshold. And, only when the data dispersedness degree corresponding to the global random area 550 is smaller than a data dispersedness degree threshold, the memory controller 104 (or the memory management circuit 202) uses the global random area 550 to store data from the host system 1000.

For instance, in the present exemplary embodiment, the memory controller 104 (or the memory management circuit 202) records an amount of the logical zones that data stored in the global random area 550 belongs to. To be specific, when updated data belonging to one logical page is written into the global random area 550, the memory controller 104 (or the memory management circuit 202) may identify the logical unit (i.e., the updated logical unit) that the logical page belongs to and the logical zone (i.e., the updated logical zone) that the logical unit belongs to. Therefore, the memory controller 104 (or the memory management circuit 202) may record an amount of the updated logical zones (i.e., the amount of the logical zones that data stored in the global random area 550 belongs to). In particular, if the amount of the updated logical zones is larger than a default value, the memory controller 104 (or the memory management circuit 202) identifies that the data dispersedness degree corresponding to the global random area 550 currently is not smaller than the data dispersedness degree threshold.

It should be noted that determining the data dispersedness degree corresponding to the global random area 550 based on the amount of the updated logical zones is an example, and the present invention is not limited thereto. For instance, in another exemplary embodiment, the memory controller 104 (or the memory management circuit 202) may determine the data dispersedness degree corresponding to the global random area 550 based on the amount of the updated logical units. For example, if the amount of the updated logical units is larger than a default value, the memory controller 104 (or the memory management circuit 202) identifies that the data dispersedness degree corresponding to the global random area 550 currently is not smaller than the data dispersedness degree threshold.

Furthermore, when the valid data merging operation for the global random area 550 is performed, the logical-to-physical address mapping tables (referred to as "the to-be-updated logical-to-physical address mapping tables") corresponding to the updated logical units need to be updated. Therefore, in another exemplary embodiment, the memory controller 104 (or the memory management circuit 202) may determine the data dispersedness degree corresponding to the global random area 550 based on the amount of the to-be-updated logical-to-physical address mapping tables. For example, if the amount of the to-be-updated logical-to-physical address mapping tables is larger than a default value, the memory controller 104 (or the memory management circuit 202) identifies that the data dispersedness degree corresponding to the global random area 550 currently is not smaller than the data dispersedness degree threshold.

In the present exemplary embodiment, if the data dispersedness degree corresponding to the global random area 550 is not smaller than the data dispersedness degree threshold, the memory controller 104 (or the memory management circuit 202) may use a child physical erasing unit to write data from the host system 1000 and updates the corresponding logical-to-physical address mapping table.

Figure 22:
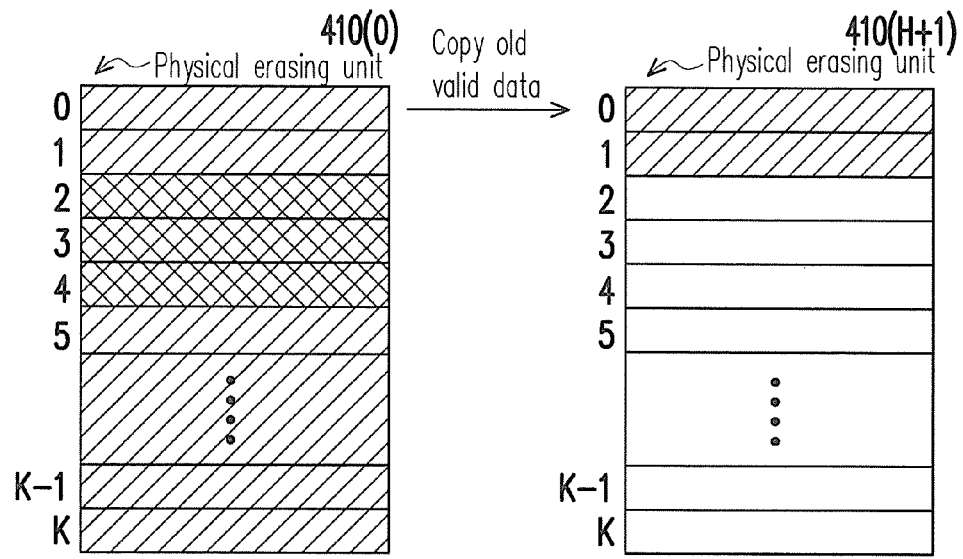
FIGS. 22-24 illustrate an example of writing updated data using a child physical erasing unit.
Figure 23:
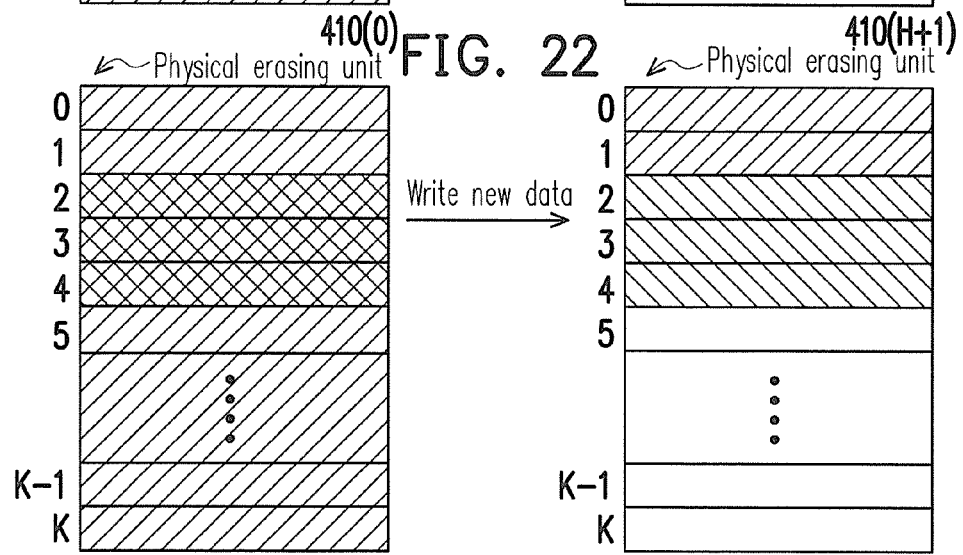
Figure 24:
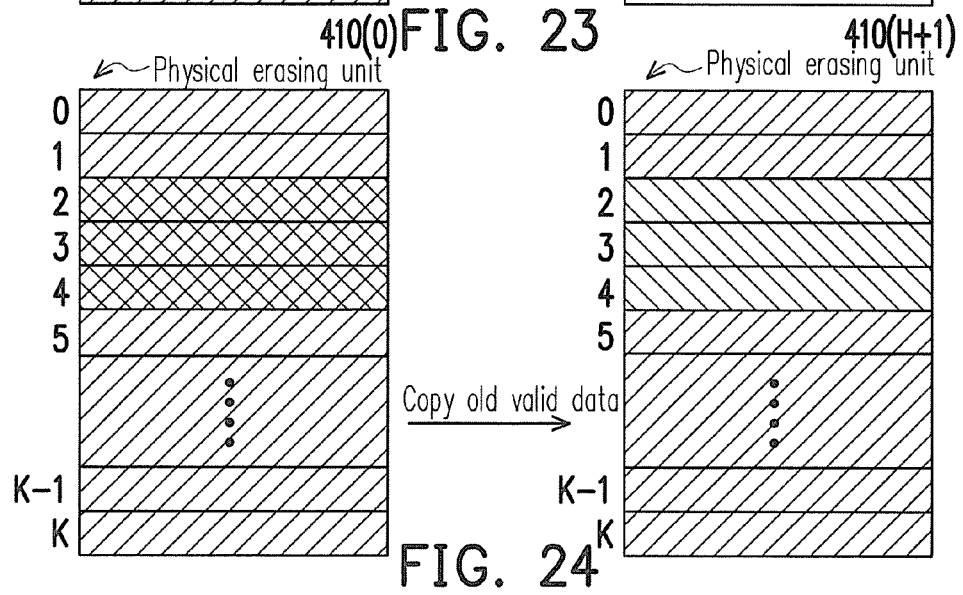

FIGS. 22~24 illustrate an example of writing updated data using a child physical erasing unit.

Referring to FIGS. 22~24, for example, if the logical unit LBA(0) currently maps to the physical erasing unit 410(0) and the memory controller 104 (or the memory management circuit 202) receives a write command indicating writing data into the logical pages belonging to the logical unit LBA(0) from the host system 1000, the memory controller 104 (or the memory management circuit 202) identifies that the logical unit LBA(0) currently maps to the physical erasing unit 410(0) based on the logical-to-physical address mapping table and selects a physical erasing unit 410(H+1) from the spare area 504 as a substitute physical erasing unit for substituting the physical erasing unit 410(0). However, when writing the new data into the physical erasing unit 410(H+1), the memory controller 104 (or the memory management circuit 202) does not have to instantly move all the valid data in the physical erasing unit 410(0) to the physical erasing unit 410(H+1) and erase the physical erasing unit 410(0). Specifically, the memory controller 104 (or the memory management circuit 202) reads the valid data before the physical programming units to be written from the physical erasing unit 410(0) (i.e. the data in the zeroth physical programming unit and the first physical programming unit of the physical erasing unit 410(0)). Afterwards, the memory controller 104 (or the memory management circuit 202) writes the valid data before the physical programming units to be written into the zeroth physical programming unit and the first physical programming unit of the physical erasing unit 410(H+1) (as shown in FIG. 22), and writes the new data into the second to the fourth physical programming units of the physical erasing unit 410 (H+1) (as shown in FIG. 23). At this time, the memory controller 104 (or the memory management circuit 202) completes the writing operation. Because the valid data in the physical erasing unit 410(0) may become invalid during a next operation (for example, a next write command), instantly moving all the valid data in the physical erasing unit 410(0) to the physical erasing unit 410(H+1) may become meaningless. Moreover, data must be orderly written into the physical programming units of the physical erasing units, therefore, the memory controller 104 (or the memory management circuit 202) may move the valid data before the physical programming unit to be written (e.g., the data stored in the zeroth physical programming unit and the data of the first physical programming unit of the physical erasing unit 410(0)), and temporarily does not move the rest of the valid data (e.g., the data stored in the fifth-Kth physical programming units of the physical erasing unit 410(0)).

In the present exemplary embodiment, the operation of maintaining such a temporary relationship is referred to as opening mother-child physical erasing units, and the original physical erasing unit (e.g., the physical erasing unit 410(0)) is referred as a mother physical erasing unit, and the substitute physical erasing unit (e.g., the physical erasing unit 410(H+1)) is referred as a child physical erasing unit.

Thereafter, the memory controller 104 (or the memory management circuit 202) integrates the physical erasing unit 410(0) and the physical erasing unit 410(H+1) into one single physical erasing unit when the data of the physical erasing unit 410(0) and the physical erasing unit 410(H+1) are required to be merged, so that the efficiency of using physical erasing units can be improved. Here, the operation of merging the mother-child physical erasing units is referred to as a data merging operation or closing mother-child physical erasing units. For instance, as shown in FIG. 24, while closing mother-child physical erasing units, the memory controller 104 (or the memory management circuit 202) reads the rest of the valid data from the physical erasing unit 410(0) (i.e., the data in the fifth-Kth physical programming units of the physical erasing unit 410(0)), writes the rest of the valid data in the physical erasing unit 410(0) into the fifth-Kth physical programming units of the physical erasing unit 410(H+1), performs the erase operation on the physical erasing unit 410(0), associates the erased physical erasing unit 410(0) with the spare area 504 and associates the physical erasing unit 410 (H+1) with the data area 502. Namely, the memory controller 104 (or the memory management circuit 202) re-maps the logical unit LBA(0) to the physical erasing unit 410 (H+1) in the logical-to-physical address mapping table. It should be noted that, because the number of the physical erasing units in the spare area 504 is limited, the number of the opened mother-child physical erasing units is also limited during the operation of the memory storage apparatus 100. Therefore, when the memory storage apparatus 100 receives a write command from the host system 1000 and the number of opened mother-child physical erasing units reaches the maximum, the memory controller 104 (or the memory management circuit 202) must close one of the opened mother-child physical erasing units, so as to execute the write command.

Figure 25:
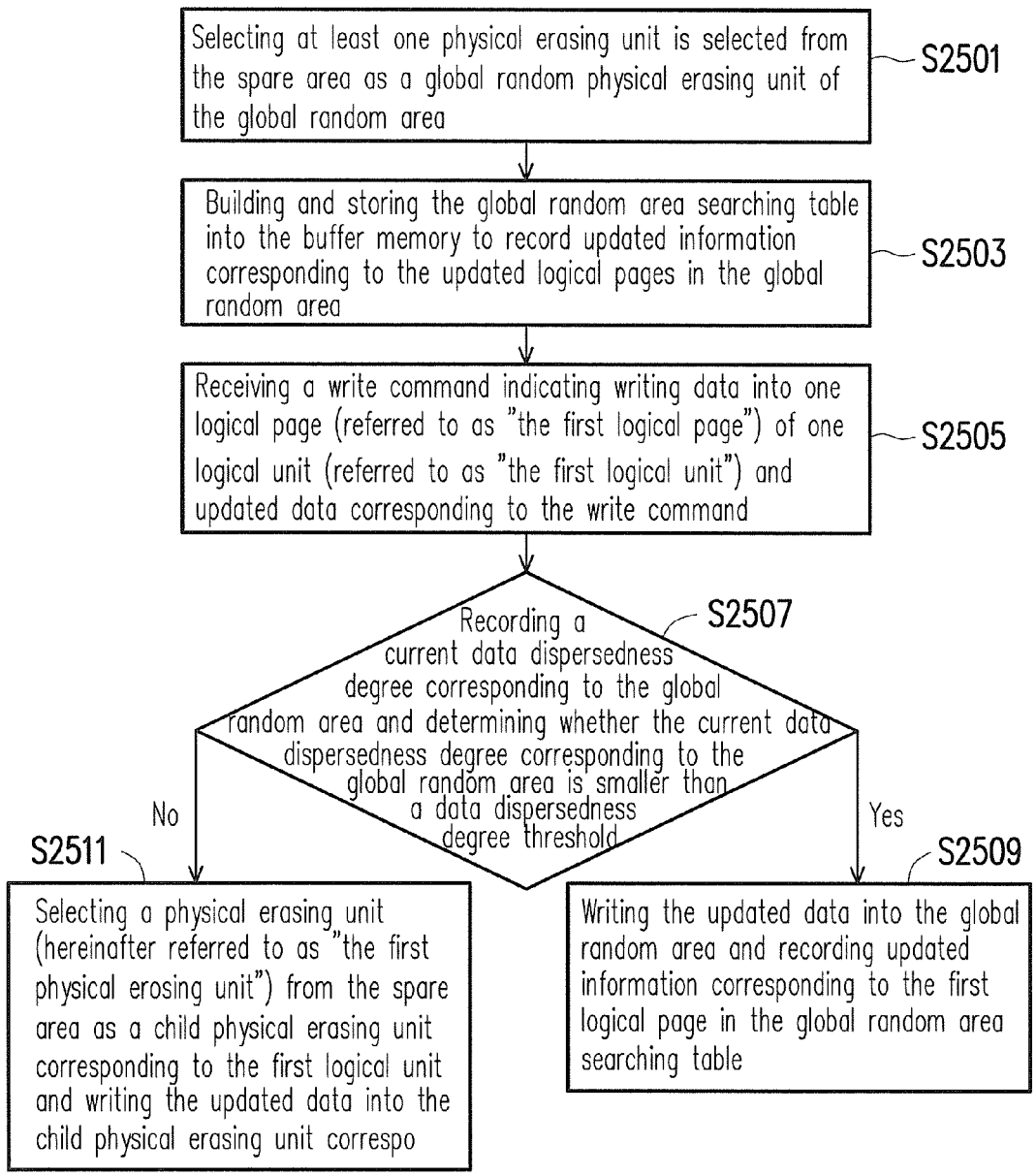
FIG. 25 is a flowchart illustrating a data writing method according to an exemplary embodiment of the present invention.

FIG. 25 is a flowchart illustrating the data writing method according to an exemplary embodiment of the present invention.

Referring to FIG. 25, in step S2501, at least one physical erasing unit is selected from the spare area 504 as a global random physical erasing unit of the global random area 550.

In step S2503, the global random area searching table is built and stored into the buffer memory 208 to record updated information corresponding to the updated logical pages in the global random area 550.

In step S2505, a write command indicating writing data into one logical page (referred to as "the first logical page") of one logical unit (referred to as "the first logical unit") and updated data corresponding to the write command are received.

In step S2507, a current data dispersedness degree corresponding to the global random area 550 is recoded and whether the current data dispersedness degree corresponding to the global random area 550 is smaller than a data dispersedness degree threshold is determined.

If the current data dispersedness degree corresponding to the global random area 550 is smaller than the data dispersedness degree threshold, in step S2509, the updated data is written into the global random area 550 and updated information corresponding to the first logical page is recorded in the global random area searching table. The method for writing the updated data into the global random area 550 and recording updated information in the global random area searching table is described above with reference to FIGS. 8-15; therefore, no relevant descriptions are given herein.

If the current data dispersedness degree corresponding to the global random area 550 is not smaller than the data dispersedness degree threshold, in step S2511, a physical erasing unit (hereinafter referred to as "the first physical erasing unit") is selected from the spare area 504 as a child physical erasing unit corresponding to the first logical unit and the updated data is written into the child physical erasing unit corresponding to the first logical unit. The method for writing the updated data with a child physical erasing unit is described above with reference to FIGS. 22~24; therefore, no relevant descriptions are given herein.

It should be noted that if the global random area 550 stores data belonging to the logical unit that the updated data belongs to, the data dispersedness degree corresponding to the global random area 550 is not increased due to the operation of writing the updated data into the global random area 550. Therefore, the updated data can be written directly into the global random area 550. For example, in another exemplary embodiment, before the step S2507, whether the global random area 550 stores data belong to the first logical unit is determined. And, if the global random area 550 stores the data belonging to the first logical unit, step S2509 is performed. And, the step S2507 is performed only if the global random area 550 does not store data belonging to the first logical unit.

In summary, the data writing method, the memory controller and the memory storage apparatus according to the exemplary embodiments of the present invention calculate the data dispersedness degree corresponding to the global random area before writing updated data and temporary store the updated data into the global random area only if the data dispersedness degree corresponding to the global random area is smaller than the data dispersedness degree threshold. Accordingly, the time needed for updating logical-to-physical address mapping tables during an execution of a valid data merging operation for global random physical erasing units can be reduced, thereby prevent a delay of executing a write command. Based on the above, the data writing method, the memory controller and the memory storage apparatus described in the exemplary embodiments of the present invention are capable of effectively improving reliability and speed of data storage. The previously described exemplary embodiments of the present invention have the advantages aforementioned, wherein the advantages aforementioned not required in all versions of the invention.

It will be apparent to those skilled in the art that various modifications and variations can be made to the structure of the present invention without departing from the scope or spirit of the present invention. In view of the foregoing, it is intended that the present invention cover modifications and variations of this invention provided they fall within the scope of the following claims and their equivalents.

What is claimed is:

1. A data writing method for writing data into a rewritable non-volatile memory module, wherein the rewritable non-volatile memory module includes a plurality of physical erasing units, each of the physical erasing units includes a plurality of physical programming units, the physical erasing units are grouped into at least a data area and a spare area, the physical erasing units of the spare area are used for substituting the physical erasing units of the data area to write data, a plurality of logical units are configured for mapping to the physical erasing units of the data area, and each of the logical units includes a plurality of logical pages, the data writing method comprising:

selecting at least one physical erasing unit from the physical erasing units of the spare area as a global random area, wherein the global random area is used for temporarily storing data belonging to a plurality of updated logical pages, and the updated logical pages belong to a plurality of updated logical units among the logical units;

building a global random area searching table to record a plurality of updated information corresponding to the updated logical pages in the global random area;

receiving a write command and an updated data corresponding to the write command, wherein the updated data belongs to a first logical page and the first logical page belongs to a first logical unit among the logical units;

recording a data dispersedness degree corresponding to the global random area;

determining whether the data dispersedness degree corresponding to the global random area is smaller than a data dispersedness degree threshold; and if the data dispersedness degree corresponding to the global random area is smaller than the data dispersedness degree threshold, writing the updated data into the global random area and recording updated information corresponding to the first logical page in the global random area searching table.

2. The data writing method according to claim 1 further comprising:

if the data dispersedness degree corresponding to the global random area is not smaller than the data dispersedness degree threshold, selecting a first physical erasing unit from the physical erasing units of the spare area as a child physical erasing unit corresponding to the first logical unit, writing the updated data into the child physical erasing unit corresponding to the first logical unit, and updating a logical-to-physical address mapping table corresponding to the first logical unit, wherein the child physical erasing unit is only used for storing data belonging to the first logical unit.

3. The data writing method according to claim 1 further comprising:

grouping the logical units into a plurality of logical zones; and configuring a plurality of logical-to-physical address mapping tables to the logical zones respectively, wherein the logical-to-physical address mapping tables record a plurality of mapping relationships between the logical units of the logical zones and the physical erasing units of the data area and each of the logical-to-physical address mapping tables is assigned to one of the logical zones.

4. The data writing method according to claim 3, wherein the updated logical units belong to a plurality of updated logical zones among the logical zones, wherein the step of recording the data dispersedness degree corresponding to the global random area comprises:

calculating an amount of the updated logical zones; and recording the amount of the updated logical zones as the data dispersedness degree corresponding to the global random area.

5. The data writing method according to claim 1, wherein the step of recording the data dispersedness degree corresponding to the global random area comprises:

calculating an amount of the updated logical units; and recording the amount of the updated logical units as the data dispersedness degree corresponding to the global random area.

6. The data writing method according to claim 1, wherein the step of recording the data dispersedness degree corresponding to the global random area comprises:

calculating an amount of a plurality of to-be-updated logical-to-physical address mapping tables, wherein the to-be-updated logical-to-physical address mapping tables record mapping relationships between the updated logical units and the physical erasing units of the data area; and recording the amount of the to-be-updated logical-to-physical address mapping tables as the data dispersedness degree corresponding to the global random area.

7. The data writing method according to claim 1 further comprising:

determining whether the global random area stores data belonging to the first logical unit;

if the global random area stores the data belonging to the first logical unit, writing the updated data into the global random area, wherein the step of determining whether the data dispersedness degree corresponding to the global random area is smaller than the data dispersedness degree threshold is performed if the global random area does not store the data belonging to the first logical unit.

8. A memory controller for controlling a rewritable non-volatile memory module, the memory controller comprising:

a host interface, coupled to a host system;

a memory interface coupled to the rewritable non-volatile memory module, wherein the rewritable non-volatile memory module includes a plurality of physical erasing units, each of the physical erasing units includes a plurality of physical programming units, the physical erasing units are grouped into at least a data area and a spare area, the physical erasing units of the spare area are used for substituting the physical erasing units of the data area to write data; and a memory management circuit coupled to the host interface and the memory interface, wherein the memory management circuit is configured to configure a plurality of logical units for mapping to the physical erasing units of the data area, wherein each of the logical units includes a plurality of logical pages, wherein the memory management circuit is configured to select at least one physical erasing unit from the spare area as a global random area, wherein the global random area temporarily stores data belonging to a plurality of updated logical pages, and the updated logical pages belong to a plurality of updated logical units among the logical units, wherein the memory management circuit is further configured to build a global random area searching table to record a plurality of updated information corresponding to the updated logical pages in the global random area, wherein the memory management circuit is further configured to receive a write command and an updated data corresponding to the write command, wherein the updated data belongs to a first logical page and the first logical page belongs to a first logical unit among the logical units, wherein the memory management circuit is further configured to record a data dispersedness degree corresponding to the global random area and determine whether the data dispersedness degree corresponding to the global random area is smaller than a data dispersedness degree threshold, wherein If the data dispersedness degree corresponding to the global random area is smaller than the data dispersedness degree threshold, the memory management circuit writes the updated data into the global random area and records updated information corresponding to the first logical page in the global random area searching table.

9. The memory controller according to claim 8, if the data dispersedness degree corresponding to the global random area is not smaller than the data dispersedness degree threshold, the memory management circuit selects a first physical erasing unit from the physical erasing units of the spare area as a child physical erasing unit corresponding to the first logical unit, writes the updated data into the child physical erasing unit corresponding to the first logical unit, and updates a logical-to-physical address mapping table corresponding to the first logical unit, wherein the child physical erasing unit is only used for storing data belonging to the first logical unit.

10. The memory controller according to claim 8, wherein the memory management circuit is further configured to group the logical units into a plurality of logical zones and configure a plurality of logical-to-physical address mapping tables respectively for the logical zones, wherein the logical-to-physical address mapping tables record a plurality of mapping relationships between the logical units of the logical zones and the physical erasing units of the data area and each of the logical-to-physical address mapping tables is assigned to one of the logical zones.

11. The memory controller according to claim 10, wherein the updated logical units belong to a plurality of updated logical zones among the logical zones, wherein in the operation of recording the data dispersedness degree corresponding to the global random area, the memory management circuit calculates an amount of the updated logical zones and records the amount of the updated logical zones as the data dispersedness degree corresponding to the global random area.

12. The memory controller according to claim 8, wherein in the operation of recording the data dispersedness degree corresponding to the global random area, the memory management circuit calculates an amount of the updated logical units and records the amount of the updated logical units as the data dispersedness degree corresponding to the global random area.

13. The memory controller according to claim 8, wherein in the operation of recording the data dispersedness degree corresponding to the global random area, the memory management circuit calculates an amount of a plurality of to-be-updated logical-to-physical address mapping tables and records the amount of the to-be-updated logical-to-physical address mapping tables as the data dispersedness degree corresponding to the global random area, wherein the to-be-updated logical-to-physical address mapping tables record mapping relationships between the updated logical units and the physical erasing units of the data area.

14. The memory controller according to claim 8, wherein the memory management circuit is further configured to determine whether the global random area stores data belonging to the first logical unit, wherein if the global random area stores the data belonging to the first logical unit, the memory management circuit writes the updated data into the global random area, wherein the memory management circuit performs the operation of determining whether the data dispersedness degree corresponding to the global random area is smaller than the data dispersedness degree threshold if the global random area does not store the data belonging to the first logical unit.

15. A memory storage apparatus, comprising:

a connector coupled to a host system;

a rewritable non-volatile memory module including a plurality of physical erasing units, wherein each of the physical erasing units includes a plurality of physical programming units, the physical erasing units are at least grouped into a data area and a spare area, and the physical erasing units of the spare area are used for substituting the physical erasing units of the data area to write data; and a memory controller coupled to the connector and the rewritable non-volatile memory module, wherein the memory controller is configured to configure a plurality of logical units for mapping to the physical erasing units of the data area, wherein each of the logical units includes a plurality of logical pages, wherein the memory controller is configured to select at least one physical erasing unit from the spare area as a global random area, wherein the global random area temporarily stores data belonging to a plurality of updated logical pages, and the updated logical pages belong to a plurality of updated logical units among the logical units, wherein the memory controller is configured to build a global random area searching table to record a plurality of updated information corresponding to the updated logical pages in the global random area, wherein the memory controller is further configured to receive a write command and an updated data corresponding to the write command, wherein the updated data belongs to a first logical page and the first logical page belongs to a first logical unit among the logical units, wherein the memory controller is further configured to record a data dispersedness degree corresponding to the global random area and determine whether the data dispersedness degree corresponding to the global random area is smaller than a data dispersedness degree threshold, wherein If the data dispersedness degree corresponding to the global random area is smaller than the data dispersedness degree threshold, the memory controller writes the updated data into the global random area and records updated information corresponding to the first logical page in the global random area searching table.

16. The memory storage apparatus according to claim 15, wherein if the data dispersedness degree corresponding to the global random area is not smaller than the data dispersedness degree threshold, the memory controller selects a first physical erasing unit from the physical erasing units of the spare area as a child physical erasing unit corresponding to the first logical unit, writes the updated data into the child physical erasing unit corresponding to the first logical unit, and updates a logical-to-physical address mapping table corresponding to the first logical unit, wherein the child physical erasing unit is only used for storing data belonging to the first logical unit.

17. The memory storage apparatus according to claim 15, wherein the memory controller is further configured to group the logical units into a plurality of logical zones and configure a plurality of logical-to-physical address mapping tables respectively for the logical zones, wherein the logical-to-physical address mapping tables record a plurality of mapping relationships between the logical units of the logical zones and the physical erasing units of the data area and each of the logical-to-physical address mapping tables is assigned to one of the logical zones.

18. The memory storage apparatus according to claim 17, wherein the updated logical units belong to a plurality of updated logical zones among the logical zones, wherein in the operation of recording the data dispersedness degree corresponding to the global random area, the memory controller calculates an amount of the updated logical zones and records the amount of the updated logical zones as the data dispersedness degree corresponding to the global random area.

19. The memory storage apparatus according to claim 15, wherein in the operation of recording the data dispersedness degree corresponding to the global random area, the memory controller calculates an amount of the updated logical units and records the amount of the updated logical units as the data dispersedness degree corresponding to the global random area.

20. The memory storage apparatus according to claim 15, wherein in the operation of recording the data dispersedness degree corresponding to the global random area, the memory controller calculates an amount of a plurality of to-be-updated logical-to-physical address mapping tables and records the amount of the to-be-updated logical-to-physical address mapping tables as the data dispersedness degree corresponding to the global random area, wherein the to-be-updated logical-to-physical address mapping tables record mapping relationships between the updated logical units and the physical erasing units of the data area.

21. The memory storage apparatus according to claim 15, wherein the memory controller is further configured to determine whether the global random area stores data belonging to the first logical unit, wherein if the global random area stores the data belonging to the first logical unit, the memory controller writes the updated data into the global random area, wherein the memory controller performs the operation of determining whether the data dispersedness degree corresponding to the global random area is smaller than the data dispersedness degree threshold if the global random area does not store the data belonging to the first logical unit.

* * * * *